(12) United States Patent
Sasaoka et al.

(10) Patent No.: US 11,825,598 B2
(45) Date of Patent: Nov. 21, 2023

(54) WIRING CIRCUIT BOARD AND PRODUCING METHOD THEREOF

(71) Applicant: NITTO DENKO CORPORATION, Osaka (JP)

(72) Inventors: Ryosuke Sasaoka, Osaka (JP); Yasunari Oyabu, Osaka (JP); Hiroaki Machitani, Osaka (JP); Hayato Takakura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 66 days.

(21) Appl. No.: 17/441,918

(22) PCT Filed: Mar. 5, 2020

(86) PCT No.: PCT/JP2020/009352
§ 371 (c)(1),
(2) Date: Sep. 22, 2021

(87) PCT Pub. No.: WO2020/195669
PCT Pub. Date: Oct. 1, 2020

(65) Prior Publication Data
US 2022/0192010 A1     Jun. 16, 2022

(30) Foreign Application Priority Data
Mar. 27, 2019 (JP) ................. 2019-060801

(51) Int. Cl.
*H05K 3/00* (2006.01)
*H05K 1/02* (2006.01)

(52) U.S. Cl.
CPC ......... *H05K 1/0266* (2013.01); *H05K 3/0017* (2013.01)

(58) Field of Classification Search
CPC ...... H05K 1/0266; H05K 1/02; H05K 3/0017; H05K 3/00; H05K 2201/09918; H05K 2201/09936; H05K 1/0269; G03F 9/00
See application file for complete search history.

(56) References Cited

FOREIGN PATENT DOCUMENTS

| JP | 61-196593 A | 8/1986 |
| JP | S61-196593 A | 8/1986 |

(Continued)

OTHER PUBLICATIONS

International Search Report Issued in PCT/JP2020/009352 dated Apr. 14, 2020.

(Continued)

*Primary Examiner* — Tarun Sinha
*Assistant Examiner* — James I Burris
(74) *Attorney, Agent, or Firm* — Edwards Neils LLC; Jean C. Edwards, Esq.

(57) ABSTRACT

A wiring circuit board includes an alignment mark layer. The alignment mark layer includes a first alignment mark and a second alignment mark. The condition A or the condition B is satisfied. Condition A: The first alignment mark has a first portion (a first starting point portion or a first center of gravity portion). The second alignment mark has a second portion (a second starting point portion or a second center of gravity portion). Condition B: The first alignment mark has the first portion, and the second alignment mark does not have the second portion, or the first alignment mark does not have the first portion, and the second alignment mark does not have the second portion.

6 Claims, 24 Drawing Sheets

(56) References Cited

FOREIGN PATENT DOCUMENTS

| | | | |
|---|---|---|---|
| JP | 03-088369 U | | 9/1991 |
| JP | 2002-223054 A | | 8/2002 |
| JP | 2002223054 A | * | 8/2002 |
| JP | 2007-258374 A | | 10/2007 |
| JP | 2012-209284 A | | 10/2012 |
| JP | 2012209284 A | * | 10/2012 |

OTHER PUBLICATIONS

Written Opinion Issued in PCT/JP2020/009352 dated Apr. 14, 2020.
International Preliminary Report on Patentability issued by WIPO dated Sep. 28, 2021, in connection with International Patent Application No. PCT/JP2020/009352.
Office Action, issued by the Japanese Patent Office dated Feb. 21, 2023, in connection with Japanese Patent Application No. 2019-060801.

* cited by examiner

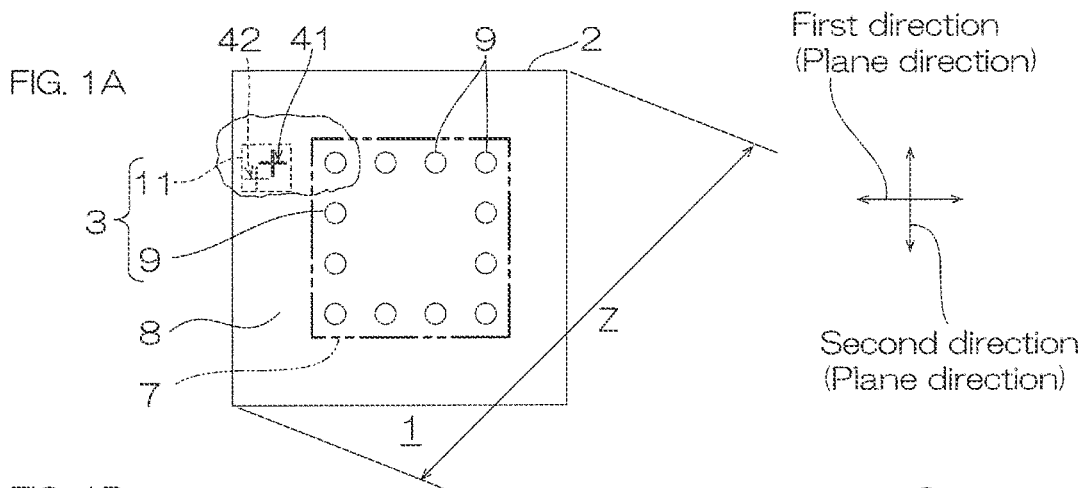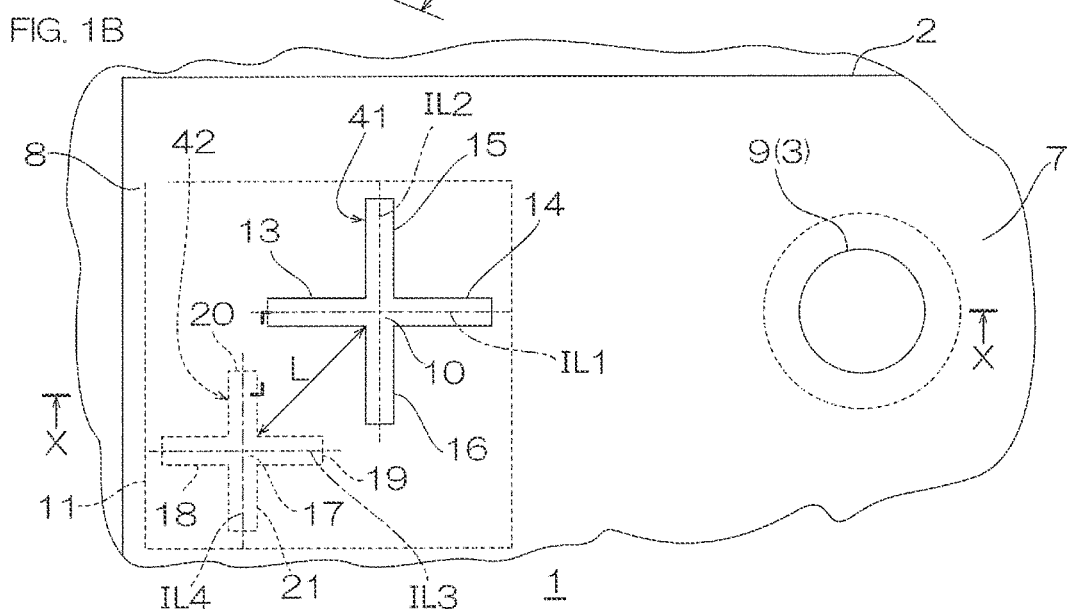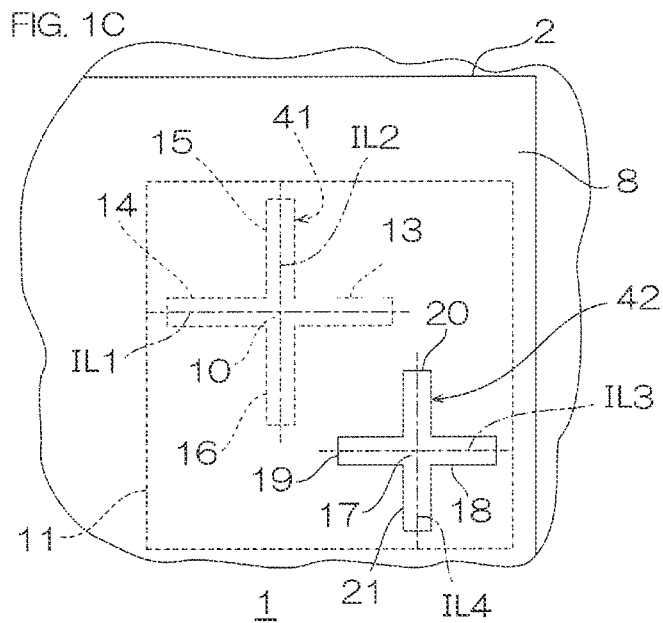

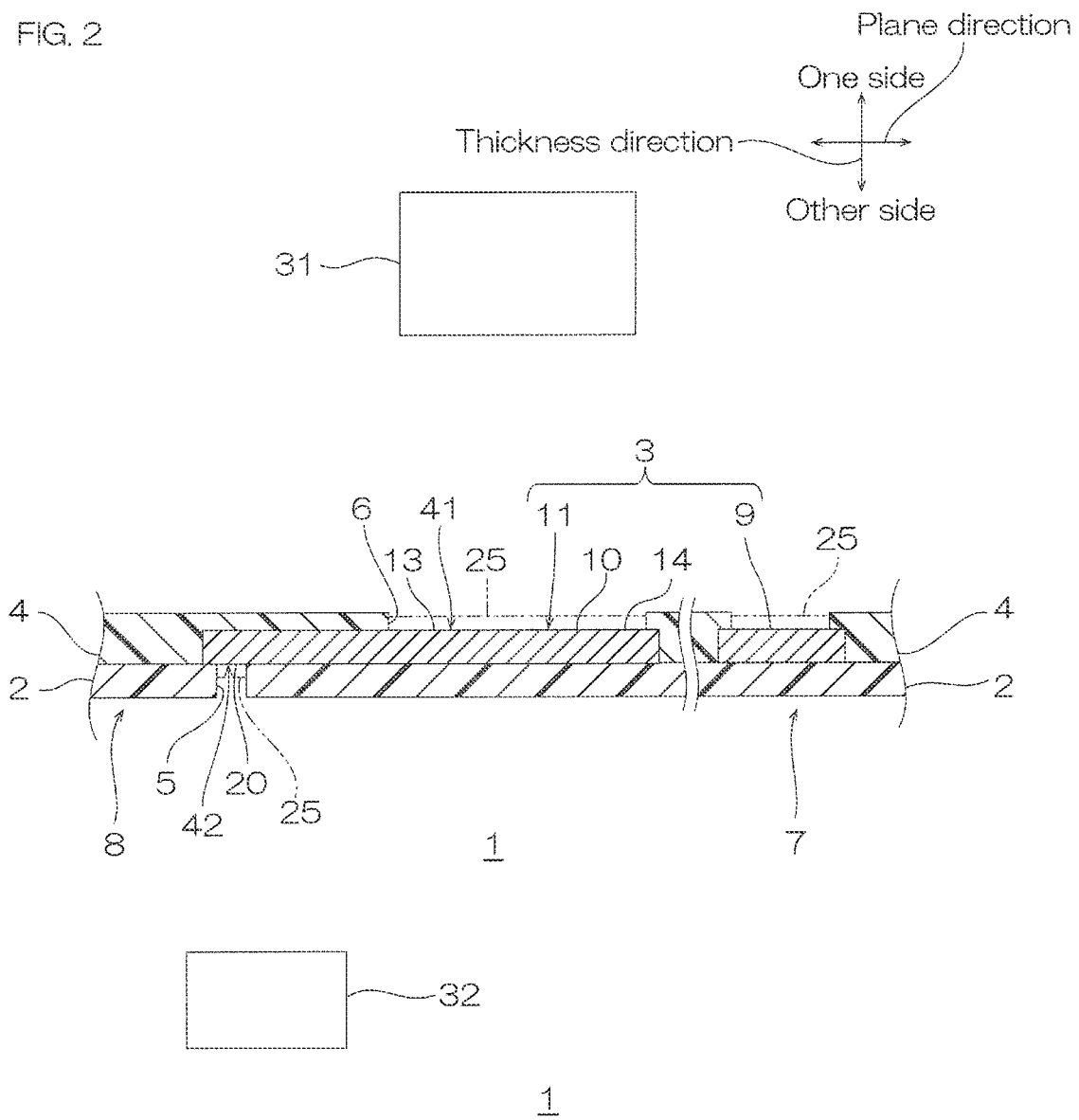

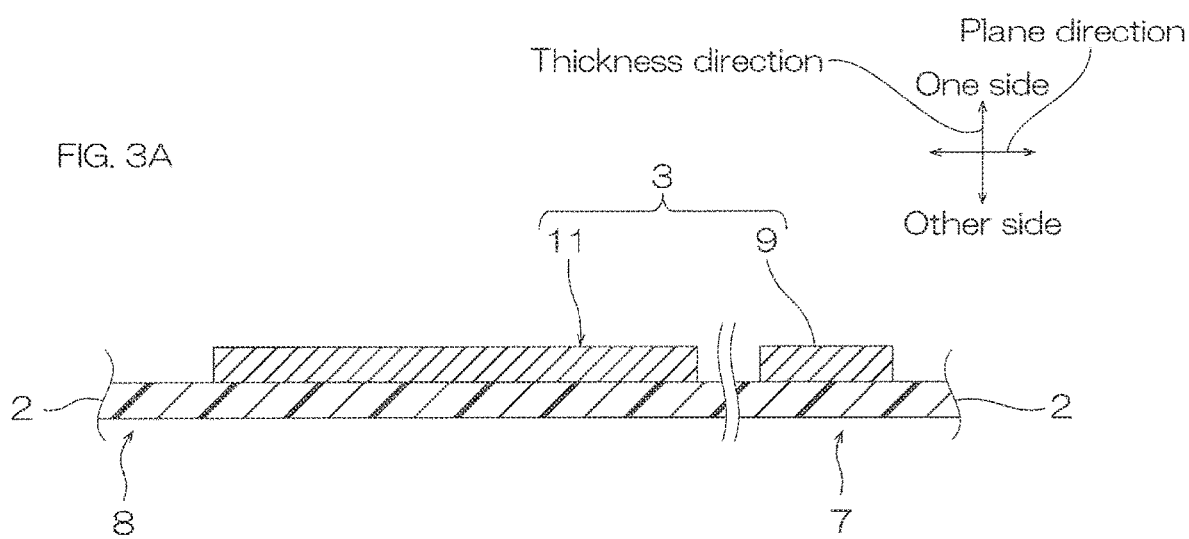
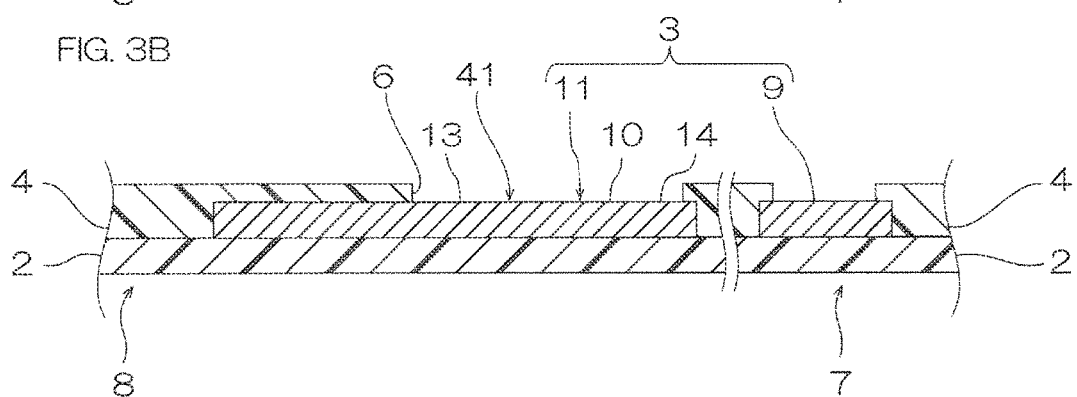
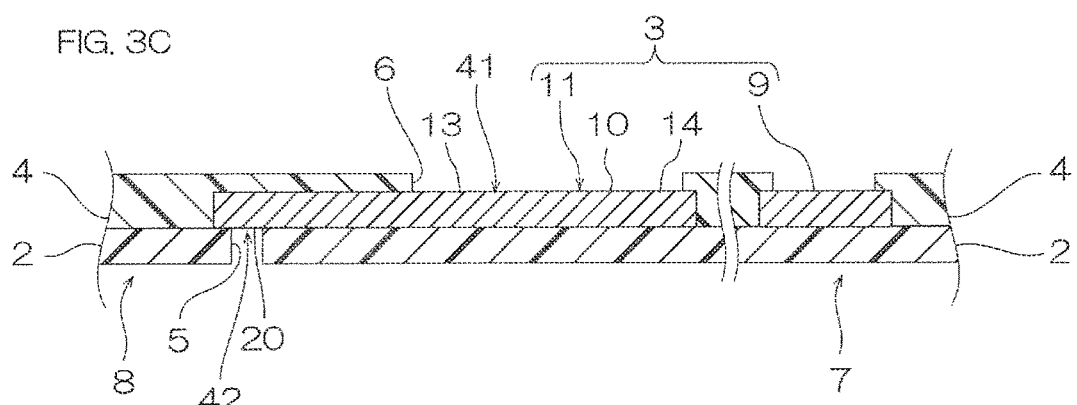
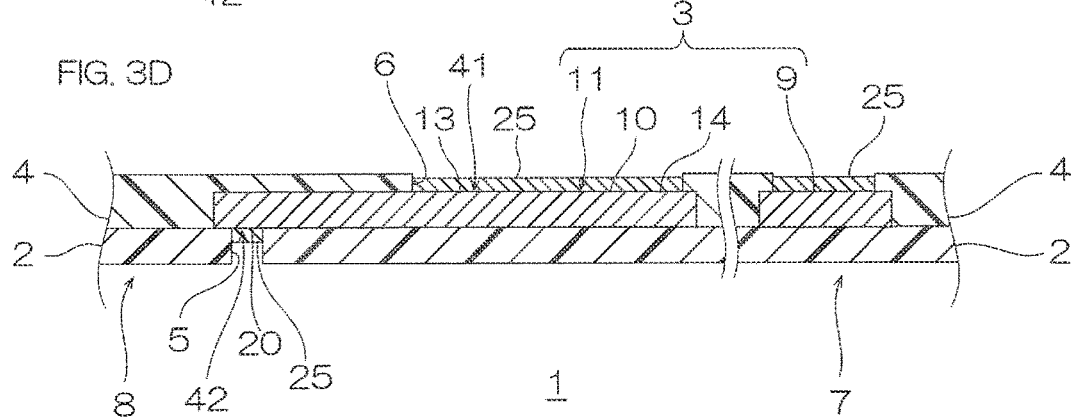

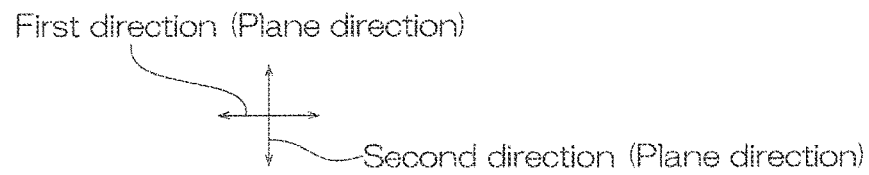
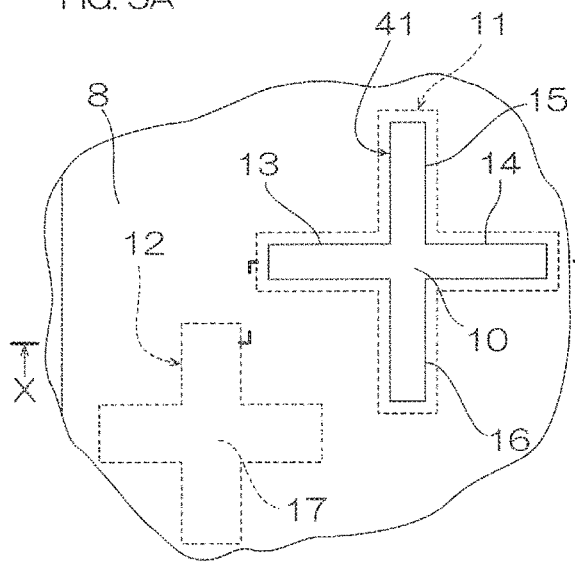
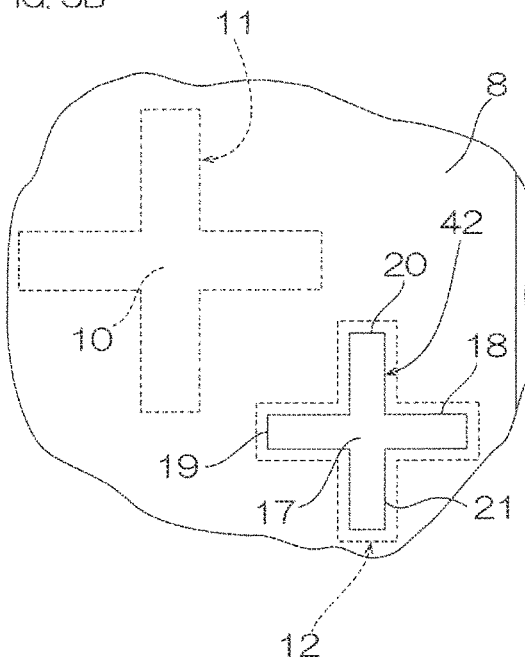
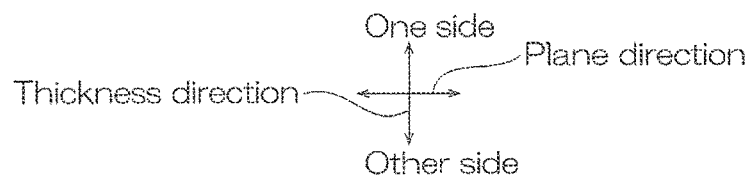
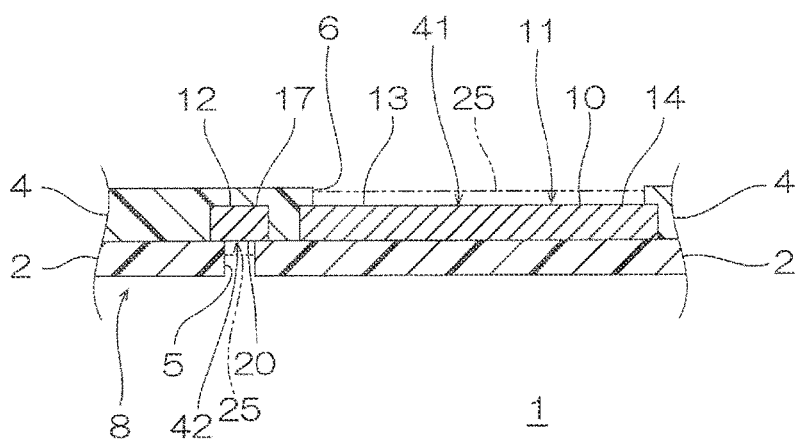

FIG. 8
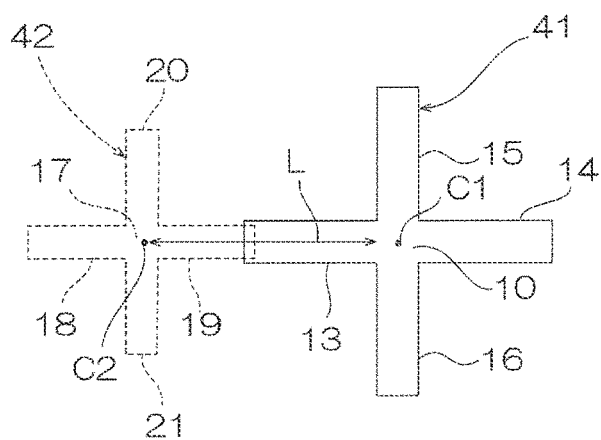
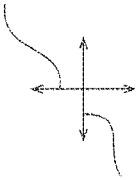
FIG. 9
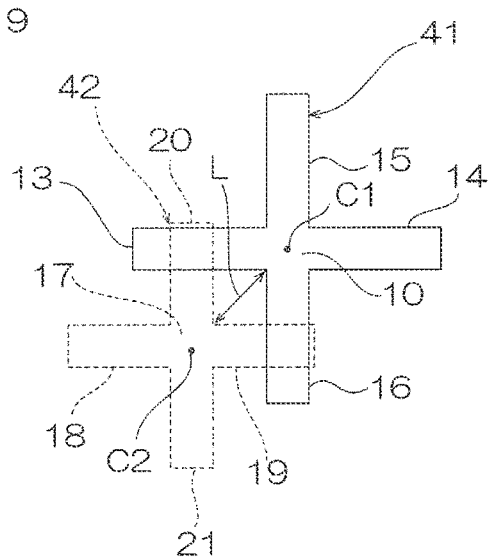
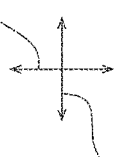
FIG. 10
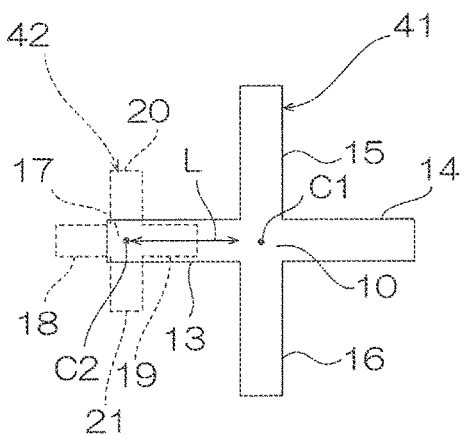
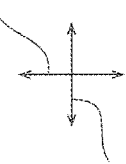

FIG. 14
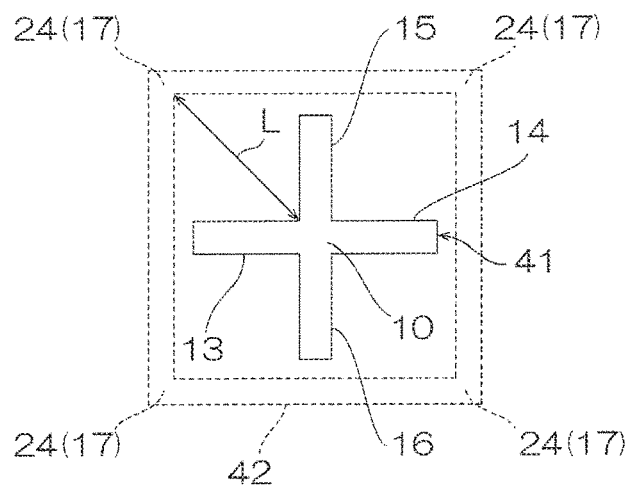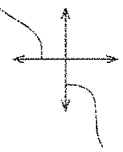
FIG. 15
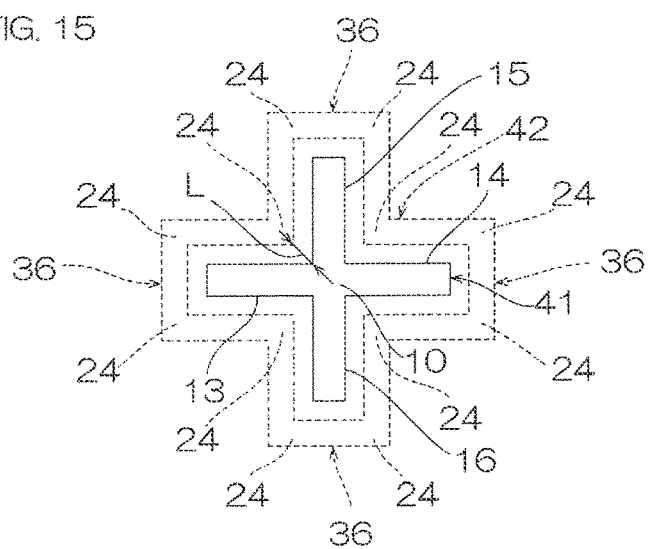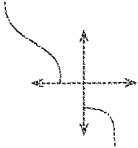
FIG. 16
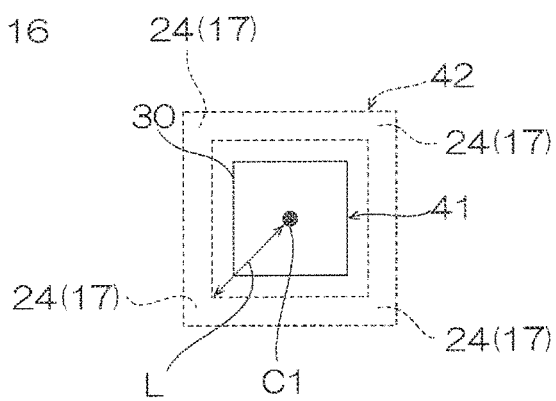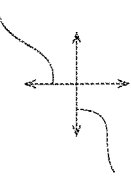

FIG. 17
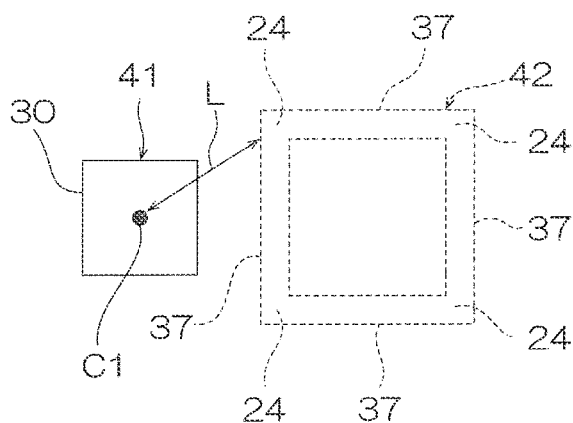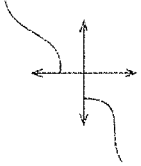
FIG. 18
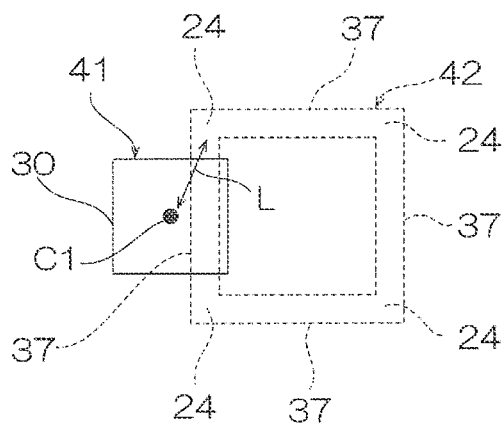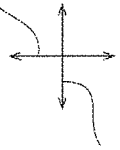
FIG. 19
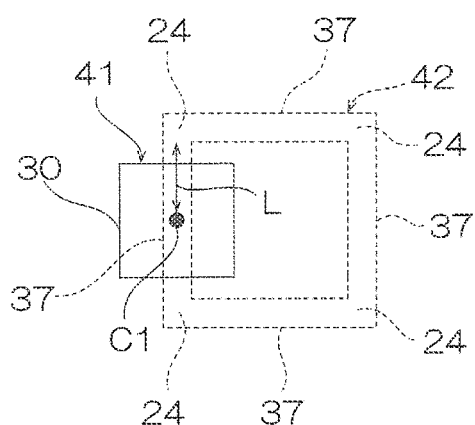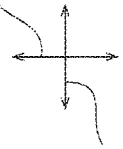

FIG. 20
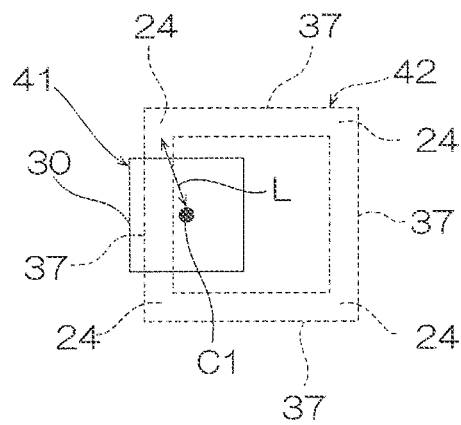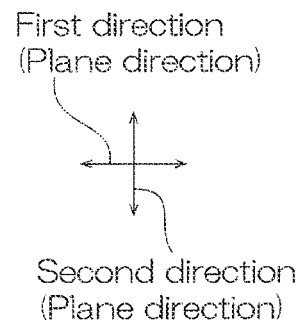
FIG. 21
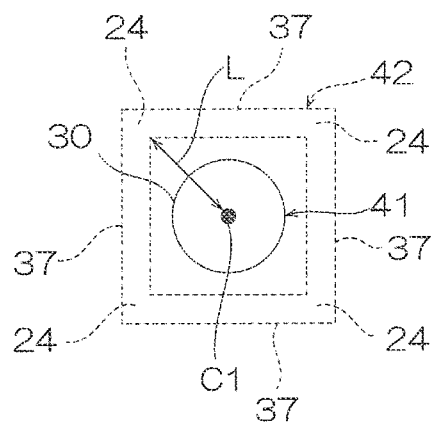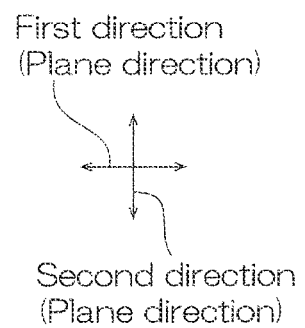
FIG. 22
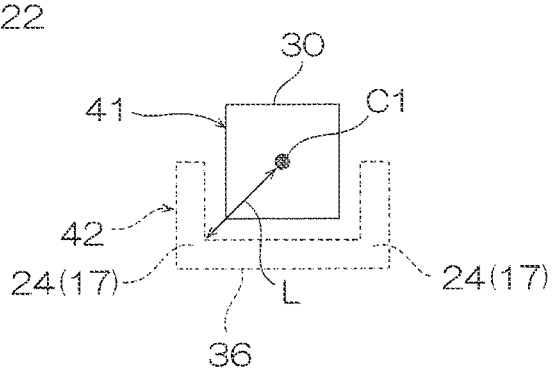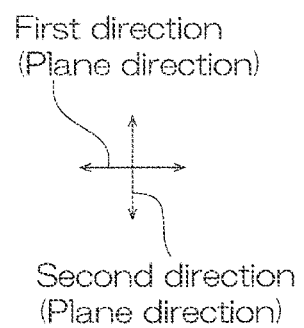

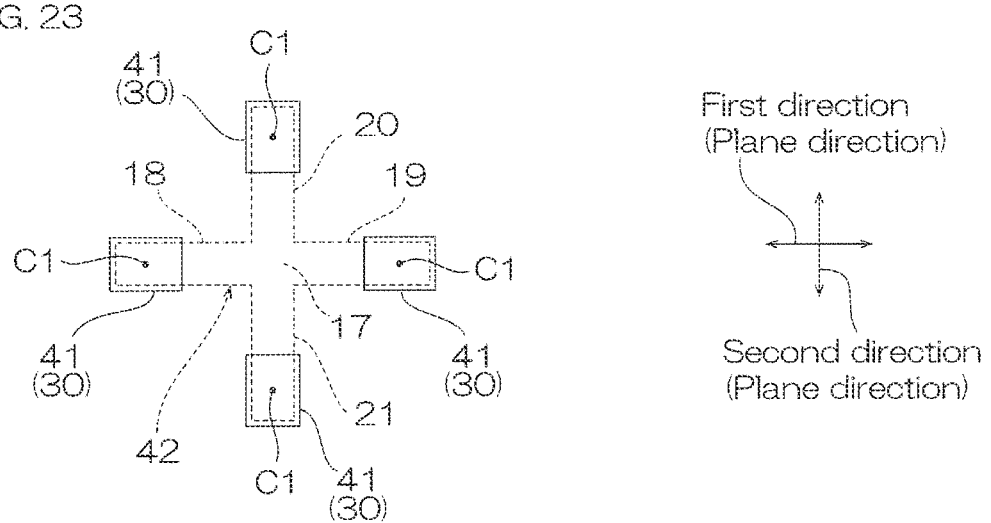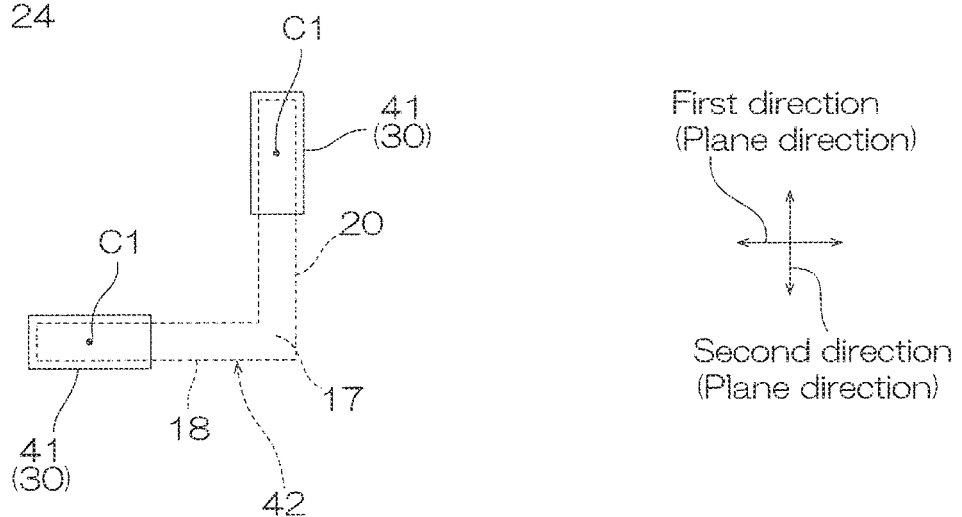

FIG. 29A
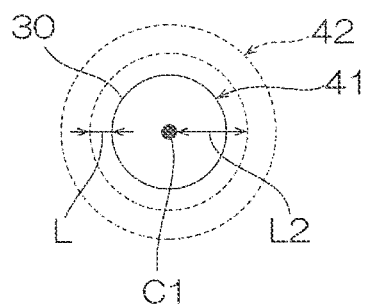
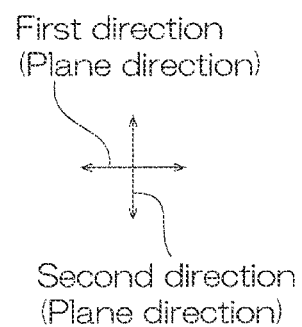
FIG. 29B
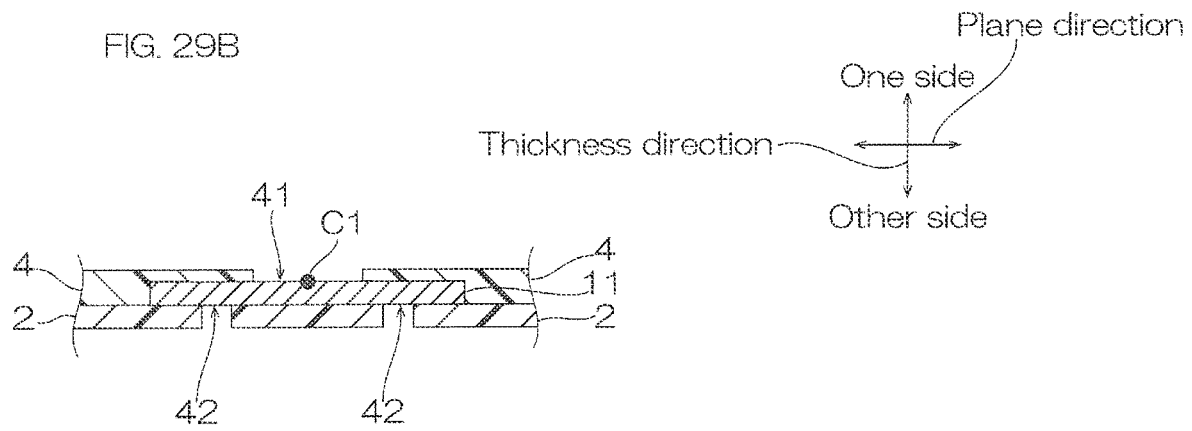

FIG. 30A
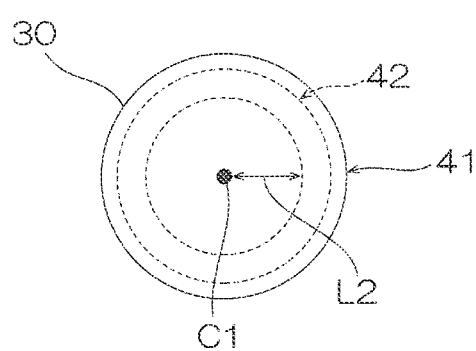
First direction
(Plane direction)
Second direction
(Plane direction)
FIG. 30B
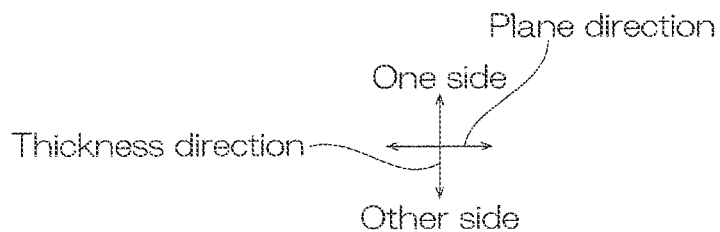
Plane direction
One side
Thickness direction
Other side
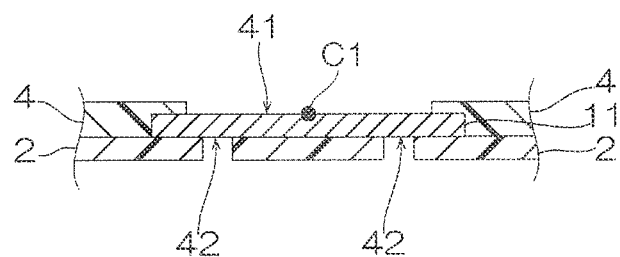

FIG. 31A
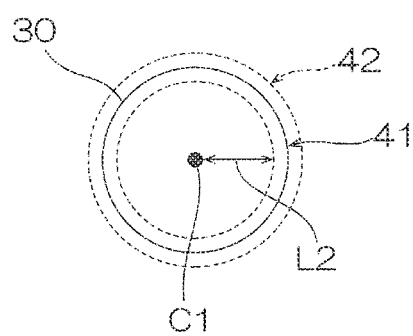
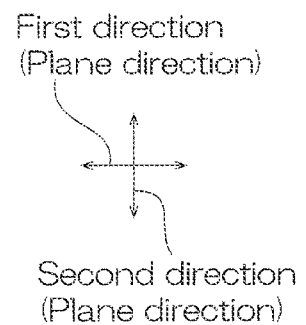
FIG. 31B
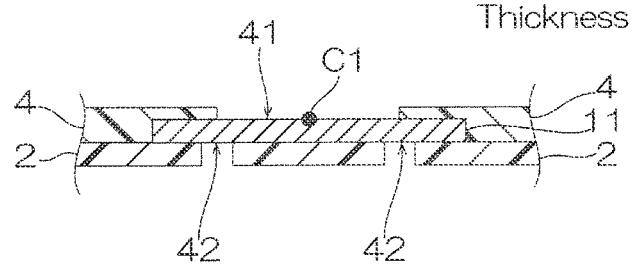
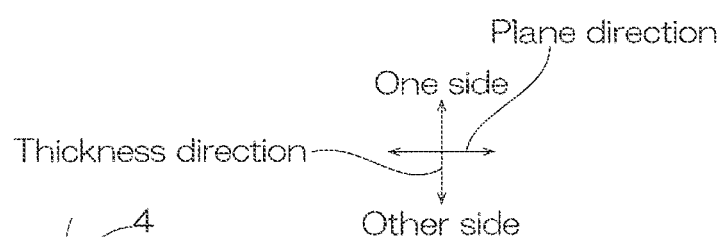

FIG. 35
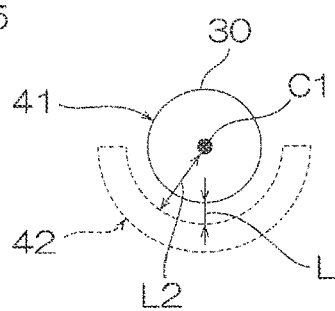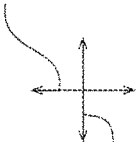
FIG. 36
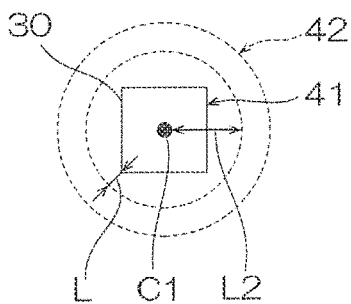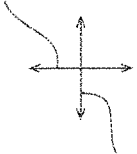
FIG. 37
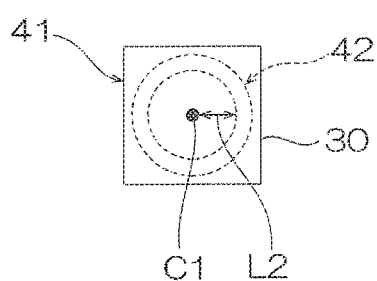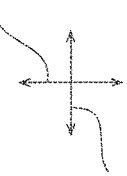
FIG. 38
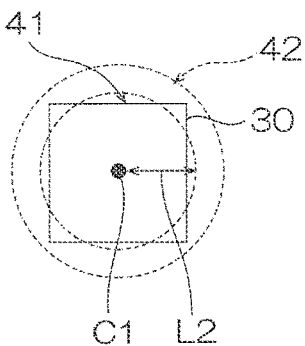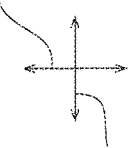

FIG. 39
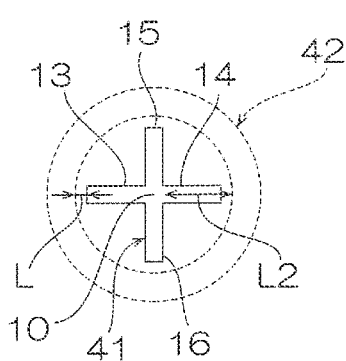
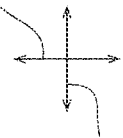
First direction
(Plane direction)
Second direction
(Plane direction)
FIG. 40
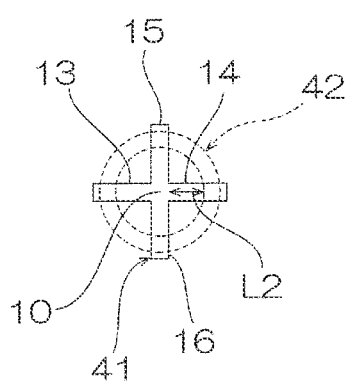
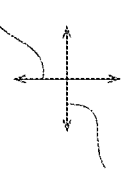
First direction
(Plane direction)
Second direction
(Plane direction)

FIG. 41A
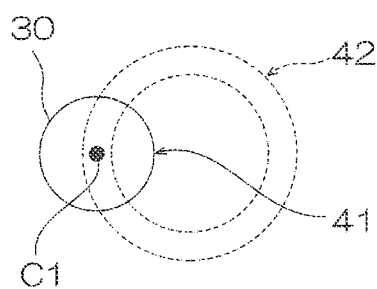
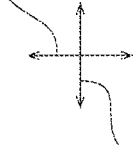
FIG. 41B
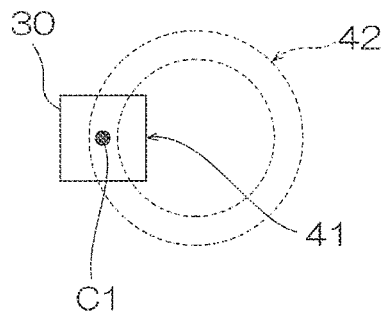
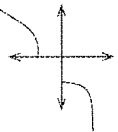
FIG. 41C
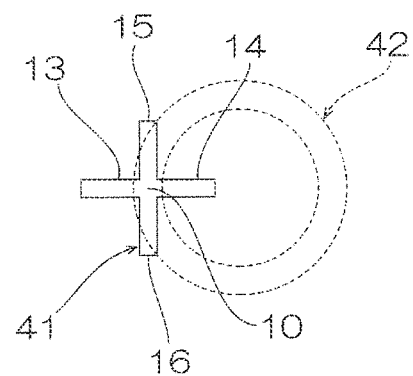
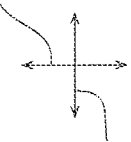

FIG. 45
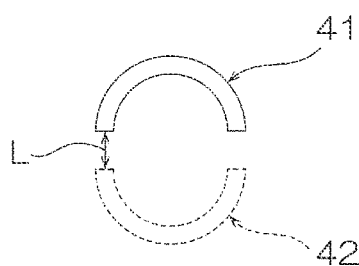 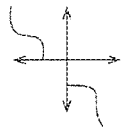
FIG. 46
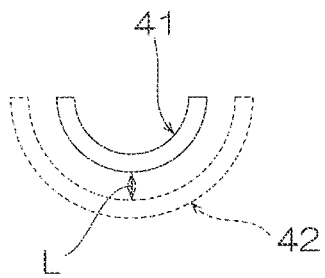 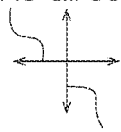
FIG. 47
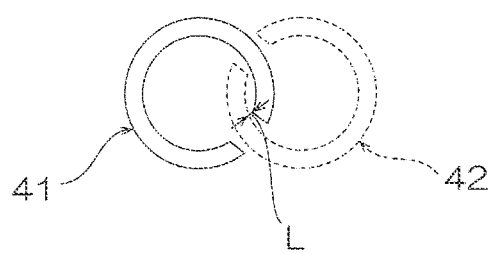 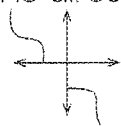

WIRING CIRCUIT BOARD AND PRODUCING METHOD THEREOF

CROSS-REFERENCE TO RELATED APPLICATIONS

The present application is a 35 U.S.C. 371 National Stage Entry PCT/JP2020/009352, filed on Mar. 5, 2020, which claims priority from Japanese Patent Application No. 2019-060801, filed on Mar. 27, 2019, the contents of all of which are herein incorporated by reference in their entirety.

TECHNICAL FIELD

The present invention relates to a wiring circuit board and a method for producing a wiring circuit board.

BACKGROUND ART

Conventionally, a wiring circuit board including an alignment mark for carrying out various alignment has been known.

For example, a wiring circuit board including a base insulating layer, a conductive mark disposed on the upper surface of the base insulating layer, and a cover insulating layer disposed on the upper surface of the base insulating layer so as to expose the conductive mark has been proposed (ref: for example, Patent Document 1).

In Patent Document 1, the conductive mark is exposed upwardly from the cover insulating layer, an image recognition camera disposed at the upper side of the wiring circuit board acquires an image of the conducive mark, and various alignment is carried out.

CITATION LIST

Patent Document

Patent Document 1: Japanese Unexamined Patent Publication No. 2007-258374

SUMMARY OF THE INVENTION

Problem to be Solved by the Invention

However, the wiring circuit board is required to further include a second conductive mark exposed downwardly from the base insulating layer in accordance with its application and purpose.

Further, in recent years, the wiring circuit board is required to be thinner, and therefore, the thinning of the conductive laver which forms the conductive mark and the second conductive mark is required.

Further, the miniaturization of the wiring circuit board is also required.

Furthermore, excellent visibility is required for the conductive mark and the second conductive mark.

The present invention provides a wiring circuit board including a first alignment mark and a second alignment mark having excellent visibility, and capable of simultaneously carrying out the alignment using these, while achieving miniaturization and thinning thereof, and a method for producing a wiring circuit board.

Means for Solving the Problem

The present invention (1) includes a wiring circuit board including an alignment mark layer and an insulating layer disposed at one side and the other side in a thickness direction of the alignment mark layer, wherein the alignment mark layer includes a first alignment mark exposed from the insulating layer toward one side in the thickness direction and a second alignment mark exposed from the insulating layer toward the other side in the thickness direction, and the first alignment mark and the second alignment mark satisfy the following condition A or condition B.

Condition A. The first alignment mark has a first portion which is at least one portion selected from the group consisting of a first starting point portion extending in a plurality of directions in a direction perpendicular to the thickness direction, and a first center of gravity portion of a solid portion continuous in the direction perpendicular to the thickness direction.

The second alignment mark has a second portion which is at least one portion selected from the group consisting of a second starting point portion extending in a plurality of directions in a direction perpendicular to the thickness direction, and a second center of gravity portion of a solid portion continuous in the direction perpendicular to the thickness direction.

The first portion is deviated from the second portion by an amount of L when viewed from the top, and a deviation amount L and the maximum length Z of the wiring circuit board satisfy the following formula.

$$Z/100{,}000 \leq L \leq Z \times^{2}\!/\!_{3}$$

Condition B: The first alignment mark has the first portion, and the second alignment mark does not have the second portion, or the first alignment mark does not have the first portion, and the second alignment mark does not have the second portion.

The shortest distance L between the first alignment mark and the second alignment mark when viewed from the top, and the maximum length Z of the wiring circuit board satisfy the following formula.

$$Z/100{,}000 \leq L \leq Z \times^{2}\!/\!_{3}$$

In order to produce the wiring circuit board, there is a case where the first alignment mark exposed toward one side in the thickness direction, and the second alignment mark exposed toward the other side are cleansed by soft etching to ensure their visibility.

However, when the first alignment mark and the second alignment mark are soft etched, along with the erosion of the alignment mark layer, the position in the thickness direction of the first alignment mark slightly moves toward the other side, and the position in the thickness direction position of the second alignment mark slightly moves toward one side.

Furthermore, in a case where the first alignment mark has the first portion which is at least one portion selected from the group consisting of the starting point portion extending in a plurality of directions, and the center of gravity portion of the solid portion, when the first alignment mark is soft etched, an etching solution tends to be retained, the erosion of the alignment mark layer of the first portion is increased, and the position in the thickness direction of the first portion greatly moves toward the other side.

Furthermore, in a case where the second alignment mark has the second portion which is at least one portion selected from the group consisting of the second starting point portion extending in a plurality of directions, and the second center of gravity portion of the solid portion, when the second alignment mark is soft etched, an etching solution tends to be retained, the erosion of the alignment mark layer of the second portion is increased, and the position in the thickness direction of the second portion greatly moves toward one side.

Therefore, when the first portion and the second portion are overlapped when viewed from the top, a through hole is formed by the movement of the position in the thickness direction of the first portion and the second portion. This is remarkable when the alignment mark layer is thin.

However, in the wiring circuit board, when the first alignment mark and the second alignment mark satisfy the condition A, since the first portion is deviated from the second portion when viewed from the top, when the first alignment mark and the second alignment mark are soft etched, it is possible to prevent the formation of a through hole due to the overlap of the first portion and the second portion even with the movement of the position in the thickness direction of the first portion toward the other side and the movement of the position in the thickness direction of the second portion toward one side. Therefore, the first alignment mark and the second alignment mark have excellent visibility.

At the same time, since the first portion is deviated from the second portion by the amount of L satisfying the above-described formula, the wiring circuit board is miniaturized, and it is possible to simultaneously carry out the alignment using the first alignment mark, and the alignment using the second alignment mark.

Further, when the first alignment mark and the second alignment mark satisfy the condition B, at least the second alignment mark does not have the second portion. Therefore, when the second alignment mark is soft etched, it is possible to suppress the retention of an etching solution due to the presence of the second portion. Therefore, it is possible to prevent the above-described formation of a through hole due to the retention of the etching solution. As a result, the first alignment mark and the second alignment mark have excellent visibility.

At the same time, since the shortest distance L between the first alignment mark and the second alignment mark when viewed from the top satisfies the above-described formula, the wiring circuit board is miniaturized, and it is possible to simultaneously carry out the alignment using the first alignment mark, and the alignment using the second alignment mark.

Therefore, the wiring circuit board includes the first alignment mark and the second alignment mark having excellent visibility, and is capable of simultaneously carrying out the alignment using these, while miniaturization and thinning thereof are achieved.

The present invention (2) includes the wiring circuit board described in (1), wherein the second alignment mark has the same shape as or a similar shape to the first alignment mark.

In the wiring circuit board, since the second alignment mark has the same shape as or the similar shape to the first alignment mark, the configuration of the first alignment mark and the second alignment mark is simple.

The present invention (3) includes the wiring circuit board described in (1) or (2), wherein the first alignment mark and the second alignment mark satisfy the condition B, the first alignment mark has the first portion, the second alignment mark does not have the second portion, the first portion is deviated from the second alignment mark by an amount of L when viewed from the top, and the deviation amount L and the maximum length Z of the wiring circuit board satisfy the following formula.

$$Z/100{,}000 \le L \le Z \times \tfrac{2}{3}$$

In the wiring circuit board, since the second alignment mark does not have the second portion, when the second alignment mark is soft etched, it is possible to suppress the great movement of the position in the thickness direction of the second alignment mark toward one side in the thickness direction.

On the other hand, even when the position in the thickness direction of the first portion greatly moves toward the other side in the thickness direction, since the first portion is deviated from the second alignment mark, it is possible to prevent the formation of a through hole due to the overlap of the first portion and the second alignment mark.

The present invention (4) includes the wiring circuit board described in any one of (1) to (3), wherein the first alignment mark and the second alignment mark are not overlapped when viewed from the top.

In the wiring circuit board, since the first alignment mark and the second alignment mark are not overlapped when viewed from the top, when the first alignment mark and the second alignment mark are soft etched, it is possible to prevent the formation of a through hole due to the overlap of the first alignment mark and the second alignment mark.

The present invention (5) includes the wiring circuit board described in (4), wherein the second alignment mark surrounds the first alignment mark when viewed from the top.

In the wiring circuit board, since the second alignment mark surrounds the first alignment mark when viewed from the top, it is possible to dispose the first alignment mark and the second alignment mark compactly. Therefore, it is possible to miniaturize the wiring circuit board.

The present invention (6) includes a method for producing a wiring circuit board, the wiring circuit board described in any one of (1) to (5), including the steps of disposing an alignment mark layer and an insulating layer, exposing a first alignment mark from the insulating layer toward one side in a thickness direction, exposing a second alignment mark from the insulating layer toward the other side in the thickness direction, and soft etching the first alignment mark and the second alignment mark.

In the producing method, in the step of soft etching the first alignment mark and the second alignment mark, even when the erosion of the alignment mark layer corresponding thereto is advanced, the position in the thickness direction of the first alignment mark moves toward the other side, and the position in the thickness direction of the second alignment mark moves toward one side, since the condition A or the condition B is satisfied, it is possible to prevent the above-described formation of a through hole due to the overlap. Therefore, it is possible to form the first alignment mark and the second alignment mark having excellent visibility.

Further, since the producing method is a method for producing the wiring circuit board described above, it is possible to produce the wiring circuit board which includes the first alignment mark and the second alignment mark having excellent visibility, and is capable of simultaneously carrying out the alignment using these, while miniaturization and thinning thereof are achieved.

Effect of the Invention

The method for producing a wiring circuit board and the wiring circuit board obtained by the producing method of the present invention include a first alignment mark and a second alignment mark having excellent visibility, and are capable of simultaneously carrying out the alignment using these, while miniaturization and thinning thereof are achieved.

BRIEF DESCRIPTION OF THE DRAWINGS

FIGS. 1A to 1C show a first embodiment of a wiring circuit board of the present invention:

FIG. 1A illustrating a plan view of the wiring circuit board,

FIG. 1B illustrating an enlarged plan view of a terminal, a first alignment mark, and a second alignment mark shown in FIG. 1A, and FIG. 1C illustrating an enlarged bottom view of the first alignment mark and the second alignment mark shown in FIG. 1B.

FIG. 2 shows a cross-sectional view of the wiring circuit board shown in FIGS. 1A to 1C and a cross-sectional view along an X-X line of FIG. 1B.

FIGS. 3A to 3D show production process views of the wiring circuit board shown in FIG. 2:

FIG. 3A illustrating a step of disposing a conductive layer on a base insulating layer, FIG. 3B illustrating a step of disposing a cover insulating layer having a cover opening portion, FIG. 3C illustrating a step of forming a base opening portion, and FIG. 3D illustrating a step of disposing a plating layer.

FIGS. 5A to 5C show cross-sectional views of a modified example of the wiring circuit board shown in FIGS. 1B to 2:

FIG. 5A illustrating a plan view of the first alignment mark and the second alignment mark, FIG. 5B illustrating a bottom view of the first alignment mark and the second alignment mark, and FIG. 5C illustrating a cross-sectional view along an X-X line shown in FIG. 5A.

FIG. 8 shows a plan view of a modified example of the first alignment mark and the second alignment mark shown in FIG. 1B.

FIG. 9 shows a plan view of a modified example of the first alignment mark and the second alignment mark shown in FIG. 1B.

FIG. 10 shows a plan view of a modified example of the first alignment mark and the second alignment mark shown in FIG. 1B.

FIG. 14 shows a plan view of a modified example of the first alignment mark and the second alignment mark shown in FIG. 1B.

FIG. 15 shows a plan view of a further modified example of the first alignment mark and the second alignment mark shown in FIG. 14.

FIG. 16 shows a plan view of a modified example of the first alignment mark and the second alignment mark shown in FIG. 1B.

FIG. 17 shows a plan view of a further modified example of the first alignment mark and the second alignment mark shown in FIG. 16.

FIG. 18 shows a plan view of a further modified example of the first alignment mark and the second alignment mark shown in FIG. 16.

FIG. 19 shows a plan view of a further modified example of the first alignment mark and the second alignment mark shown in FIG. 16.

FIG. 20 shows a plan view of a further modified example of the first alignment mark and the second alignment mark shown in FIG. 16.

FIG. 21 shows a plan view of a further modified example of the first alignment mark and the second alignment mark shown in FIG. 16.

FIG. 22 shows a plan view of a further modified example of the first alignment mark and the second alignment mark shown in FIG. 16.

FIG. 23 shows a plan view of a further modified example of the first alignment mark and the second alignment mark shown in FIG. 1B.

FIG. 24 shows a plan view of a further modified example of the first alignment mark and the second alignment mark shown in FIG. 23.

FIGS. 29A to 29B show a first alignment mark and a second alignment mark of a second embodiment.

FIG. 29A illustrating a plan view and

FIG. 29B illustrating a cross-sectional view.

FIGS. 30A to 30B show a modified example of the first alignment mark and the second alignment mark shown in FIGS. 29A to 29B:

FIG. 30A illustrating a plan view and

FIG. 30B illustrating a cross-sectional view.

FIGS. 31A to 30B show a modified example of the first alignment mark and the second alignment mark shown in FIGS. 29A to 29B:

FIG. 31A illustrating a plan view and

FIG. 31B illustrating a cross-sectional view.

FIG. 35 shows a plan view of a further modified example of the first alignment mark and the second alignment mark shown in FIG. 29A.

FIG. 36 shows a plan view of a further modified example of the first alignment mark and the second alignment mark shown in FIG. 29A.

FIG. 37 shows a plan view of a further modified example of the first alignment mark and the second alignment mark shown in FIG. 29A.

FIG. 38 shows a plan view of a further modified example of the first alignment mark and the second alignment mark shown in FIG. 29A.

FIG. 39 shows a plan view of a further modified example of the first alignment mark and the second alignment mark shown in FIG. 29A.

FIG. 40 shows a plan view of a further modified example of the first alignment mark and the second alignment mark shown in FIG. 29A.

FIGS. 41A to 41C show plan views of a further modified example (modified example in which the first portion is overlapped with the second alignment mark) of the first alignment mark and the second alignment mark shown in FIGS. 29A, 36, and 39:

FIG. 41A illustrating a further modified example of the first alignment mark and the second alignment mark shown in FIG. 29A, FIG. 41B illustrating a further modified example of the first alignment mark and the second alignment mark shown in FIG. 36, and FIG. 41C illustrating a further modified example of the first alignment mark and the second alignment mark shown in FIG. 39.

FIG. 42A illustrating a plan view and

FIG. 42B illustrating a cross-sectional view.

FIG. 45 shows a plan view of a modified example of the first alignment mark and the second alignment mark shown in FIG. 42A.

FIG. 46 shows a plan view of a modified example of the first alignment mark and the second alignment mark shown in FIG. 42A.

FIG. 47 shows a plan view of a modified example of the first alignment mark and the second alignment mark shown in FIG. 42A.

FIG. 48A illustrating a plan view and

FIG. 48B illustrating a cross-sectional view.

DESCRIPTION OF EMBODIMENTS

Figure 4:
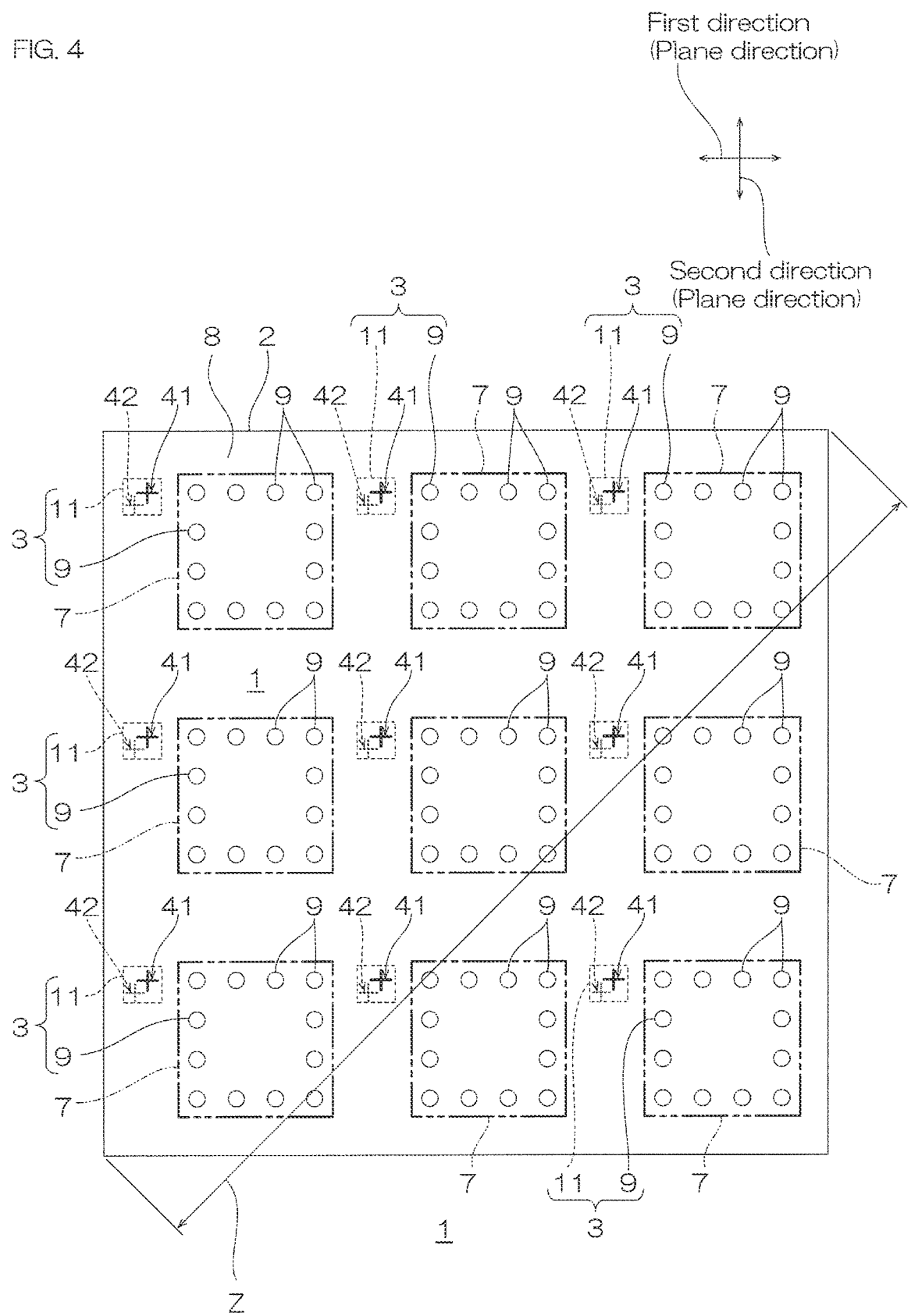
FIG. 4 shows a plan view of a modified example (embodiment in which a plurality of mounting regions are provided) of the wiring circuit board shown in FIG. 1A.

A first embodiment corresponds to a wiring circuit board satisfying the condition A of the present invention, and a second embodiment to a third embodiment correspond to a wiring circuit board satisfying the condition B of the present invention.

In the first embodiment, a first alignment mark (described later) has a first portion (described later), and a second alignment mark (described later) has a second portion (described later), in the second embodiment, the first alignment mark has the first portion, and the second alignment mark does not have the second portion; and in the third embodiment, the first alignment mark does not have the first portion, and the second alignment mark does not have the second portion.

First Embodiment

The first embodiment of the wiring circuit board of the present invention is described with reference to FIGS. 1A to 2.

In FIG. 1A, in order to clearly show the relative arrangement of a first alignment mark 41 and a second alignment mark 42 (described later), a cover insulating layer 4 (described later) is omitted.

Further, in FIG. 1B, a peripheral end edge of an alignment mark layer 11 and the second alignment mark 42 are not visually recognized when viewed from the top, and drawn by a broken line in order to clearly show the relative arrangement with the first alignment mark 41.

Further, in FIG. 1C, the peripheral end edge of the alignment mark layer 11 and the first alignment mark 41 are not visually recognized when viewed from the bottom, and drawn by the broken line in order to clearly show the relative arrangement with the second alignment mark 42.

In FIGS. 1A to 2, a wiring circuit board 1 has a generally flat plate shape. Specifically, it has one surface and the other surface facing each other in a thickness direction, and they extend in a plane direction perpendicular to the thickness direction.

A size of the wiring circuit board 1 when viewed from the top is appropriately adjusted by a size of an electronic element (described later) to be mounted and the like, and specifically, is adjusted so as to have the maximum length Z in the plane direction to be described later (more specifically, for the maximum length Z and a deviation amount L (described later) to satisfy the formula). Specifically, the maximum length Z of the wiring circuit board 1 is, for example, 1 mm or more, preferably 5 mm or more, and for example, 50 mm or less, preferably 30 mm or less.

Specifically, the wiring circuit board 1 has a generally rectangular flat plate shape. The wiring circuit board 1 has a mounting region 7 located at its central portion, and a peripheral region 8.

The mounting region 7 is a region having a generally rectangular shape when viewed from the top in which the electronic element (not shown) is mounted on one surface of the wiring circuit board 1. The one mounting region 7 is provided per the one wiring circuit board 1. A plurality of terminals 9 are provided inside the mounting region 7. The plurality of terminals 9 are disposed adjacent to each other at spaced intervals in a peripheral direction along the peripheral end portion of the mounting region 7.

The peripheral region 8 is a region located around the mounting region 7. The alignment mark layer 11 is provided in the peripheral region 8. In the alignment mark layer 11, the first alignment mark 41 and the second alignment mark 42 are partitioned.

Then, the wiring circuit board 1 sequentially includes a base insulating layer 2 as one example of an insulating layer, a conductive layer 3, and a cover insulating layer 4 as one example of an insulating layer in order toward one side in the thickness direction.

The base insulating layer 2 has the same outer shape as the wiring circuit board 1. The base insulating layer 2 has one surface and the other surface facing each other in the thickness direction. Further, the base insulating layer 2 has a base opening portion 5 corresponding to the second alignment mark 42 in the peripheral region 8. The base opening portion 5 is a through hole penetrating the base insulating layer 2 in the thickness direction, and exposes the second alignment mark 42.

An example of a material for the base insulating layer 2 includes an insulating resin such as a polyimide resin. A thickness of the base insulating layer 2 is, for example, 0.1 μm or more, preferably 0.5 μm or more, more preferably 1 μm or more, and for example, 50 μm or less, preferably 30 μm or less, more preferably 20 μm or less.

The conductive layer 3 is disposed on one surface of the base insulating layer 2. The conductive layer 3 includes the terminal 9, a wiring (not shown), and the alignment mark layer 11.

In the mounting region 7, the terminal 9 is disposed on one surface of the base insulating layer 2 in the above-described pattern.

In the mounting region 7, the wiring which is not shown is disposed on one surface of the base insulating layer 2, and connects the terminals 9 to each other.

The alignment mark layer 11 is supported by the base insulating layer 2. Specifically, the alignment mark layer 11 is disposed on one surface of the base insulating layer 2 in the peripheral region 8. In other words, the base insulating layer 2 is disposed at the other side in the thickness direction of the alignment mark layer 11.

The alignment mark layer 11 has a generally rectangular flat plate shape, and specifically, has one surface and the other surface facing each other in the thickness direction. A size of the alignment mark layer 11 is adjusted so as to have a region in which the first alignment mark 41 and the second alignment mark 42 to be described later are formed.

A material for the conductive layer 3 is a metal (including an alloy) which allows erosion by soft etching to be described later, and an example thereof includes a conductor such as copper.

A thickness of the conductive layer 3 is extremely thin, and specifically, is, for example, 15 μm or less, preferably 10 μm or less, more preferably 8 μm or less, and for example, 0.1 μm or more, preferably 0.3 μm or more, more preferably 0.5 μm or more.

The cover insulating layer 4 is disposed on one surface of the base insulating layer 2 so as to expose the terminal 9 and cover the wiring which is not shown.

In the peripheral region 8, the cover insulating layer 4 has a cover opening portion 6 corresponding to the first alignment mark 41. The cover opening portion 6 is a through hole penetrating the cover insulating layer 4 in the thickness direction, and exposes the first alignment mark 41.

A material for the cover insulating layer 4 is the same as the material for the base insulating layer 2. A thickness of the cover insulating layer 4 is, for example, 0.1 μm or more, preferably 0.5 μm or more, more preferably 1 μm or more, and for example, 50 μm or less, preferably 30 μm or less, more preferably 20 μm or less.

Next, the first alignment mark 41 and the second alignment mark 42 satisfying the condition A are described in detail.

The first alignment mark 41 is a portion exposed from the cover opening portion 6 toward one side in one surface of the alignment mark layer 11.

The first alignment mark 41 has a generally+shape (plus-shaped) (or cross-shaped) when viewed from the top. Specifically, the first alignment mark 41 integrally has a first starting point portion 10 as one example of a first portion, a first extending portion 13, a second extending portion 14, a third extending portion 15, and a fourth extending portion 16.

The first starting point portion 10 is a portion serving as a starting point for the first extending portion 13, the second extending portion 14, the third extending portion 15, and the fourth extending portion 16 stretching (extending) in a plurality of directions.

Each of the first extending portion 13 and the second extending portion 14 has a cut piece (strip) shape extending from the first starting point portion 10 toward one side or the other side in a first direction included in the plane direction (corresponding to a right-left direction in FIGS. 1A and 1B) (one example of a part of the plurality of directions). More specifically, the first extending portion 13 and the second extending portion 14 have a generally linear shape extending from the first starting point portion 10 toward the opposite side to each other. The first extending portion 13 and the second extending portion 14 are located on a first phantom line IL1 passing through the first starting point portion 10.

Each of the third extending portion 15 and the fourth extending portion 16 has a cut piece (strip) shape extending from the first starting point portion 10 toward one side or the other side in a second direction included in the plane direction and perpendicular to the first direction and the thickness direction (corresponding to an up-down direction in FIGS. 1A and 1B) (one example of a part of the plurality of directions). More specifically, the third extending portion 15 and the fourth extending portion 16 have a generally linear shape extending from the first starting point portion 10 toward the opposite side to each other. The third extending portion 15 and the fourth extending portion 16 are located on a second phantom line IL2 passing through the first starting point portion 10. The second phantom line IL2 is perpendicular to the first phantom line IL1.

In one surface of the alignment mark layer 11, the peripheral portion of the first alignment mark 41 is covered with the cover insulating layer 4.

The second alignment mark 42 is a portion exposed from the base opening portion 5 toward the other side in the other surface of the alignment mark layer 11.

The second alignment mark 42 has a shape similar to the first alignment mark 41 when viewed from the top. Specifically, the second alignment mark 42 has a generally+shape (plus-shaped) (or cross-shaped) when viewed from the top. The second alignment mark 42 has a shape smaller than the first alignment mark 41 when viewed from the top.

Specifically, the second alignment mark 42 integrally has a second starting point portion 17 as one example of a second portion, a fifth extending portion 18, a sixth extending portion 19, a seventh extending portion 20, and an eighth extending portion 21.

The second starting point portion 17 is a portion serving as a starting point for the fifth extending portion 18, the sixth extending portion 19, the seventh extending portion 20, and the eighth extending portion 21 stretching (extending) in a plurality of directions.

Each of the fifth extending portion 18 and the sixth extending portion 19 has a cut piece (strip) shape extending from the second starting point portion 17 toward one side or the other side in the first direction. More specifically, the fifth extending portion 18 and the sixth extending portion 19 have a generally linear shape extending from the second starting point portion 17 toward the opposite side to each other. The fifth extending portion 18 and the sixth extending portion 19 are located on a third phantom line IL3 passing through the second starting point portion 17. The third phantom line IL3 is parallel to the first phantom line IL1.

Each of the seventh extending portion 20 and the eighth extending portion 21 has a cut piece (strip) shape extending from the second starting point portion 17 toward one side or the other side in the second direction. More specifically, the seventh extending portion 20 and the eighth extending portion 21 have a generally linear shape extending from the second starting point portion 17 toward the opposite side to each other. The seventh extending portion 20 and the eighth extending portion 21 are located on a fourth phantom line IL4 passing through the second starting point portion 17. The fourth phantom line IL4 is parallel to the second phantom line IL2.

In the other surface of the alignment mark layer 11, the peripheral portion of the second alignment mark 42 is covered with the base insulating layer 2.

Then, in the wiring circuit board 1, the first starting point portion 10 is not overlapped with the second starting point portion 17, and disposed to be deviated therefrom when viewed from the top.

Further, the first starting point portion 10 is not overlapped with any of the second starting point portion 17, the fifth extending portion 18, the sixth extending portion 19, and the seventh extending portion 20, and disposed to be deviated therefrom when viewed from the top.

Further, the second starting point portion 17 is not overlapped with any of the first extending portion 13, the second extending portion 14, the third extending portion 15, and the fourth extending portion 16, and disposed to be deviated therefrom when viewed from the top.

That is, the first alignment mark 41 and the second alignment mark 42 are not overlapped with each other, and disposed to be deviated when viewed from the top. The first alignment mark 41 and the second alignment mark 42 are disposed at spaced intervals to each other when viewed from the top.

When viewed from the top, the deviation amount (length) L of the first starting point portion 10 and the second starting point portion 17 is the shortest distance L between the first starting point portion 10 and the second starting point portion 17, and together with the maximum length Z of the wiring circuit board 1, satisfies the following formula.

$$Z/100,000 \leq L \leq Z \times 2/3$$

When the deviation amount L is above the above-described $[Z \times 2/3]$, the alignment using the first alignment mark 41, and the alignment using the second alignment mark 42 cannot be simultaneously carried out, and also, since it is necessary that the first alignment mark 41 and the second alignment mark 42 are widely disposed in the peripheral region 8, the miniaturization of the wiring circuit board 1 cannot be achieved.

On the other hand, when the deviation amount L is below the above-described [Z/100,000], it is impossible to further more reliably suppress the formation of a through hole due to soft etching (cleansing) to be described later.

The upper limit of the deviation amount L is preferably $[Z \times 1/2]$, more preferably $[Z \times 1/3]$, further more preferably $[Z \times 1/4]$.

Further, the lower limit of the deviation amount L is preferably [Z/10,000], more preferably [Z/5,000], further more preferably [Z/3,000].

Specifically, the deviation amount L is, for example, 10 mm or less, preferably 7.5 mm or less, more preferably 5 mm or less, further more preferably 3 mm or less, and for example, 0.05 mm or more, preferably 0.03 mm or more, more preferably 0.1 mm or more.

A size of the first alignment mark 41 and the second alignment mark 42 is appropriately set in accordance with its application and purpose of the wiring circuit board 1. Specifically, the plane area of the first starting point portion 10 is, for example, 10 $\mu m^2$ or more, preferably 100 $\mu m^2$ or more, and for example, 10,000,000 $\mu m^2$ or less, preferably 100,000 $\mu m^2$ or less. Each of the extending length of the first extending portion 13, the second extending portion 14, the third extending portion 15, and the fourth extending portion 16 is, for example, 0.01 mm or more, preferably 0.03 mm or more, more preferably 0.05 mm or more, and for example, 10 mm or less, preferably 3 mm or less, more preferably 1 mm or less.

A ratio of the plane area of the second starting point portion 17 to the plane area of the first starting point portion 10 is, for example, 1 or less, preferably 0.9 or less, more preferably 0.75 or less, and for example, 0.1 or more, preferably 0.3 or more.

The length of the first extending portion 13, the second extending portion 14, the third extending portion 15, and the fourth extending portion 16 is longer than that of the fifth extending portion 18, the sixth extending portion 19, the seventh extending portion 20, and the eighth extending portion 21, respectively.

A ratio of the extending length of the first extending portion 13 to the extending length of the fifth extending portion 18 is, for example, above 1, preferably 1.1 or more, more preferably 1.2 or more, and for example, 10 or less. A ratio of the extending length of the second extending portion 14 to the extending length of the sixth extending portion 19, a ratio of the extending length of the third extending portion 15 to the extending length of the seventh extending portion 20, and a ratio of the extending length of the fourth extending portion 16 to the extending length of the eighth extending portion 21 are the same as the above-described ratio of the extending length of the first extending portion 13 to the extending length of the fifth extending portion 18.

Next, a method for producing the wiring circuit board 1 is described with reference to FIGS. 3A to 3C.

As shown in FIG. 3A, first, in this method, the base insulating layer 2 is prepared, and next, the conductive layer 3 is disposed on one surface of the base insulating layer 2.

The base insulating layer 2 is, for example, prepared from a generally sheet shape extending in the plane direction, and does not have the above-described base opening portion 5 (ref. FIG. 3C).

The conductive layer 3 is, for example, formed on one surface of the base insulating layer 2 into a pattern having the wiring (not shown), the terminal 9, and the alignment mark layer 11 by an additive method, a subtractive method, and the like.

As shown in FIG. 3B, next, in this method, the cover insulating layer 4 is formed on one surface of the base insulating layer 2 into a pattern having the cover opening portion 6.

Thus, in one surface of the alignment mark layer 11, the first alignment mark 41 exposed from the cover opening portion 6 is formed (partitioned).

As shown in FIG. 3C, next, in this method, the base opening portion 5 is formed in the base insulating layer 2.

To form the base opening portion 5 in the base insulating layer 2, for example, etching, laser, and the like is used.

Thus, in the other surface of the alignment mark layer 11, the second alignment mark 42 exposed from the base opening portion 5 is formed (partitioned).

Thereafter, the first alignment mark 41 and the second alignment mark 42 are cleansed.

Specifically, the first alignment mark 41 and the second alignment mark 42 are, for example, cleansed by soft etching.

In the soft etching, the conditions (kind of etching solution, time, temperature, and the like) in which along with the erosion of the alignment mark layer 11, the position in the thickness direction of the first alignment mark 41 slightly moves toward the other side in the thickness direction, and the position in the thickness direction of the second alignment mark 42 slightly moves toward one side in the thickness direction are selected.

In the soft etching of the first alignment mark 41, an etching solution easily flows from the first extending portion 13 to the fourth extending portion 16 toward the first starting point portion 10, and therefore, the etching solution is retained in the first starting point portion 10, so that the speed at which the position in the thickness direction of the first starting point portion 10 moves toward the other side in the thickness direction is faster than that of the first extending portion 13 to the fourth extending portion 16.

In the soft etching of the second alignment mark 42, an etching solution easily flows from the fifth extending portion 18 to the eighth extending portion 21 toward the second starting point portion 17, and therefore, the etching solution is retained in the second starting point portion 17, so that the speed at which the position in the thickness direction of the second starting point portion 17 moves toward one side in the thickness direction is faster than that of the fifth extending portion 18 to the eighth extending portion 21.

On the other hand, in the alignment mark layer 11, since the other surface facing the first alignment mark 41 is covered (masked) with the base insulating layer 2, the movement of the position in the thickness direction of the other surface by the above-described soft etching does not occur.

Further, in the alignment mark layer 11, since one surface facing the second alignment mark 42 is covered (masked) with the cover insulating layer 4, the movement of the position in the thickness direction of one surface by the above-described soft etching does not occur.

Thus, the wiring circuit board 1 including the base insulating layer 2, the conductive layer 3, and the cover insulating layer 4 is obtained.

As shown in FIG. 2, thereafter, the alignment of the electronic element (not shown) and the wiring circuit board 1 is carried out by a first image recognition camera 31 disposed at one side in the thickness direction of the wiring circuit board 1 and a second image recognition camera 32 disposed at the other side in the thickness direction of the wiring circuit board 1.

In this alignment, the first image recognition camera 31 recognizes the first alignment mark 41, and the second image recognition camera 32 recognizes the second alignment mark 42.

Then, in the wiring circuit board 1, the first alignment mark 41 and the second alignment mark 42 satisfy the condition A, and the first starting point portion 10 is deviated from the second starting point portion 17 when viewed from the top. Therefore, when the first alignment mark 41 and the second alignment mark 42 are soft etched, it is possible to prevent the formation of a through hole due to the overlap of the first starting point portion 10 and the second starting point portion 17 even with the movement of the position in the thickness direction of the first starting point portion 10 toward the other side, and the movement of the position in the thickness direction of the second starting point portion 17 toward one side. Therefore, the first alignment mark 41 and the second alignment mark 42 have excellent visibility.

At the same time, since the first starting point portion 10 is deviated from the second starting point portion 17 by the amount of L satisfying the above-described formula, the wiring circuit board 1 is miniaturized, and it is possible to simultaneously carry out the alignment using the first alignment mark 41 and the alignment using the second alignment mark 42.

Therefore, the wiring circuit board 1 includes the first alignment mark 41 and the second alignment mark 42 having excellent visibility, and is capable of simultaneously carrying out the alignment using these, while miniaturization and thinning thereof are achieved.

In the wiring circuit board 1, since the second alignment mark 42 has the similar shape to the first alignment mark 41, the configuration of the first alignment mark 41 and the second alignment mark 42 is simple.

Further, in the wiring circuit board 1, even when the position in the thickness direction of the first alignment mark 41 moves toward the other side and the position in the thickness direction of the second alignment mark 42 moves toward one side by soft etching, since the first alignment mark 41 and the second alignment mark 42 are not overlapped when viewed from the top, it is possible to prevent the formation of a through hole due to the overlap of the first alignment mark 41 and the second alignment mark 42.

In the above-described method for producing the wiring circuit board 1, in the step of soft etching the first alignment mark 41 and the second alignment mark 42, even when the erosion of the alignment mark layer 11 corresponding thereto is advanced, the position in the thickness direction of the first alignment mark 41 moves toward the other side, and the position in the thickness direction of the second alignment mark 42 moves toward one side, since the first alignment mark 41 and the second alignment mark 42 satisfy the condition A, it is possible to prevent the formation of a through hole due to the above-described overlap. Therefore, it is possible to form the first alignment mark 41 and the second alignment mark 42 having excellent visibility.

Further, since the method for producing the wiring circuit board 1 is a method for producing the above-described wiring circuit board 1, it is possible to produce the wiring circuit board 1 including the first alignment mark 41 and the second alignment mark 42 having excellent visibility, and capable of simultaneously carrying out the alignment using these, while miniaturization and thinning thereof are achieved.

MODIFIED EXAMPLES

In each modified example below, the same reference numerals are provided for members and steps corresponding to each of those in the above-described first embodiment, and their detailed description is omitted Each modified example can achieve the same function and effect as that of the first embodiment unless otherwise specified. Furthermore, the first embodiment and each modified example can be appropriately used in combination.

As shown in FIG. 1A, in the wiring circuit board 1, one mounting region 7 is provided.

However, the number of the mounting regions 7 in the wiring circuit board 1 is not limited to the description above, and the number may be plural.

As shown in FIG. 4, in the modified example, the nine mounting regions 7 are, for example, disposed in the wiring circuit board 1. Specifically, three columns in the first direction and three columns in the second direction, that is, the nine mounting regions 7 in total are disposed in parallel at spaced intervals to each other.

The wiring circuit board 1 including the plurality of mounting regions 7 has the longer maximum length Z in the plane direction than the wiring circuit board 1 including the one mounting region 7 (ref: FIG. 1A). The maximum length Z in the plane direction thereof is not particularly limited, and is, for example, 10 mm or more, preferably 25 mm or more, and for example, 1,000 mm or less.

Then, even in the wiring circuit board 1, when viewed from the top, the maximum length Z of the wiring circuit board 1, and the deviation amount L of the first starting point portion 10 and the second starting point portion 17 satisfy the following formula.

$$Z/100,000 \leq L \leq Z \times 2/3$$

As shown in FIG. 4, the first alignment mark 41 is provided in a one-to-one correspondence with respect to the mounting region 7. Alternatively, though not shown, the one first alignment mark 41 may be also provided with respect to the plurality of mounting regions 7 (that is, the one wiring circuit board 1). This is also the same as the second alignment mark 42.

In the first embodiment, the second alignment mark 42 is smaller than the first alignment mark 41 when viewed from the top, and the magnitude relationship may be reversed.

As shown by a phantom line of FIG. 2, and FIG. 3D, the wiring circuit board 1 may further include a plating layer 25. The plating layer 25 is disposed on the first alignment mark 41 and the second alignment mark 42. Examples of a material for the plating layer 25 include gold and nickel.

To dispose the plating layer 25, as shown in FIG. 3D, the first alignment mark 41 and the second alignment mark 42 after cleansing are subjected to plating (for example, electrolytic plating and the like). The plating layer 25 may be a plurality of layers to which a plurality of plating is subjected.

In a case where the wiring circuit board 1 includes the plating layer 25, the plating layer 25 corresponding to the first alignment mark 41 is recognized by the first image recognition camera 31, and also, the plating layer 25 corresponding to the second alignment mark 42 is recognized by the second image recognition camera 32.

In the first embodiment, as shown in FIGS. 3A to 3C, the conductive layer 3 is disposed before forming the base opening portion 5. Alternatively, though not shown, first, the base opening portion 5 may be formed in the base insulating layer 2, and then, the conductive layer 3 may be disposed in the base insulating layer 2. For example, the base insulating layer 2 in which the base opening portion 5 is formed in advance is prepared, and then, the conductor layer 3 is laminated (formed) on one surface of the base insulating layer 2 by a subtractive method.

In the first embodiment, as shown in FIG. 2, the first alignment mark 41 and the second alignment mark 42 are provided in the common alignment mark layer 11. However, as shown in FIGS. 5A to 5C, the first alignment mark 41 and the second alignment mark 42 may be also provided in separate alignment mark layers.

As shown in FIGS. 5A to 5C, the first alignment mark 41 is partitioned in the alignment mark laser 11, and the second alignment mark 42 is partitioned in a second alignment mark layer 12.

The first alignment mark 41 is exposed from the cover opening portion 6 toward one side on one surface of the alignment mark layer 11.

The second alignment mark 42 is exposed from the base opening portion 5 toward the other side on the other surface of the second alignment mark layer 12 provided independently of the alignment mark layer 11.

In the modified example, as shown in FIG. 5A, the alignment mark layer 11 includes the first alignment mark 41, is larger than the first alignment mark 41, and has a similar shape to the first alignment mark 41 when viewed from the top. Specifically, the alignment mark layer 11 has a generally+shape (plus-shaped) (or cross-shaped) when viewed from the top which is larger than the first alignment mark 41. One surface of the peripheral end portion of the alignment mark layer 11 is covered with the cover insulating layer 4.

The second alignment mark layer 12 is disposed on one surface of the base insulating layer 2 at spaced intervals to the alignment mark layer 11 in the plane direction. The second alignment mark layer 12 includes the second alignment mark 42, is larger than the second alignment mark 42, and has a similar shape to the second alignment mark 42 when viewed from the top. Specifically, the second alignment mark layer 12 has a generally+shape (plus-shaped) (or cross-shaped) when viewed from the top which is larger than the second alignment mark 42. The other surface of the peripheral end portion of the second alignment mark layer 12 is covered with the base insulating layer 2.

Figure 6:
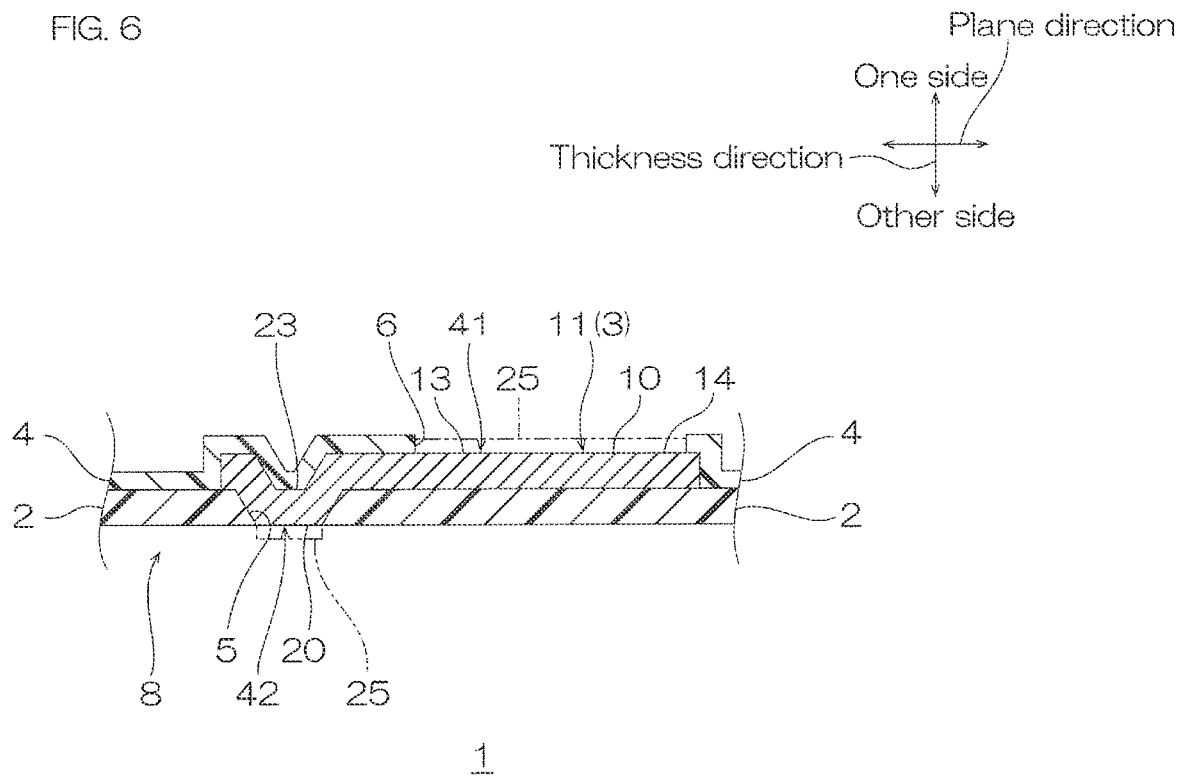
FIG. 6 shows a cross-sectional view of a modified example of the wiring circuit board shown in FIG. 2.

As shown in FIG. 6, the alignment mark layer 11 may have a filling portion 23 filling the base opening portion 5 of the base insulating layer 2. The other surface of the filling portion 23 is one example of the second alignment mark 42, and is flush with the other surface of the base insulating layer 2.

Further, though not shown, the second alignment mark 42 may also have the same shape as the first alignment mark 41 when viewed from the top.

Figure 7:
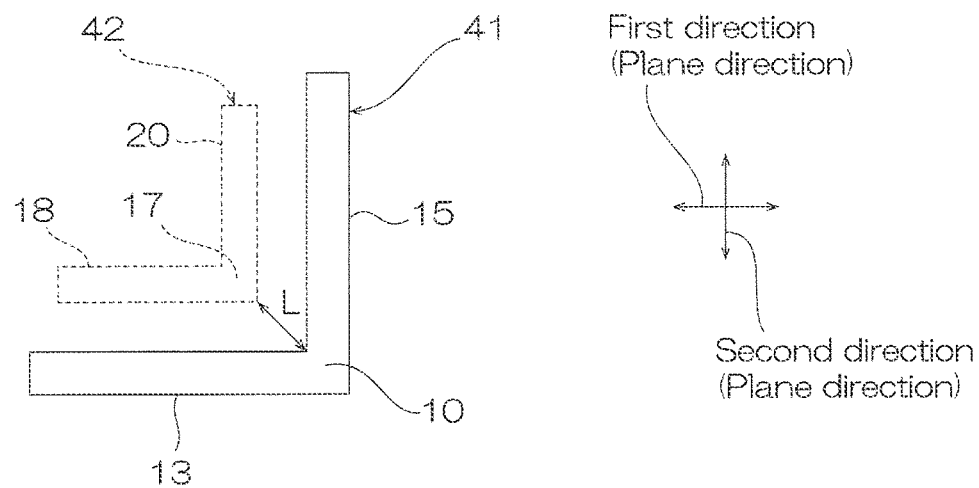
FIG. 7 shows a plan view of a modified example of the first alignment mark and the second alignment mark shown in FIG. 1B.

As shown in FIG. 7, each of the first alignment mark 41 and the second alignment mark 42 may also have a generally L-shape when viewed from the top.

Specifically, the first alignment mark 41 shown in FIG. 7 does not include the second extending portion 14 and the fourth extending portion 16 shown in FIG. 1B, and includes the first starting point portion 10, the first extending portion 13, and the third extending portion 15.

The second alignment mark 42 shown in FIG. 7 does not include the sixth extending portion 19 and the eighth extending portion 21 shown in FIGS. 1B to 1C, and includes the second starting point portion 17, the fifth extending portion 18, and the seventh extending portion 20.

In the first embodiment shown in FIG. 1B, when viewed from the top, the second alignment mark 42 is not overlapped with the first alignment mark 41, and in the modified examples of FIGS. 8 to 10, the second alignment mark 42 is allowed to be partially overlapped with the first alignment mark 41.

However, it is necessary that the first starting point portion 10 and the second starting point portion 17 are disposed to be deviated when viewed from the top.

In the modified example shown in FIG. 8, a free end portion of the first extending portion 13 of the first alignment mark 41 and a free end portion of the sixth extending portion 19 of the second alignment mark 42 are overlapped when viewed from the top.

In the modified example, as compared with the wiring circuit board 1 shown in FIG. 1B in which the first alignment mark 41 and the second alignment mark 42 are not overlapped when viewed from the top, it is possible to dispose the first alignment mark 41 and the second alignment mark 42 compactly.

In the modified example shown in FIG. 8, one extending portion in the first alignment mark 41, and one extending portion in the second alignment mark 42 are overlapped when viewed from the top. Alternatively, in the modified example shown in FIG. 9, two extending portions in the first alignment mark 41, and two extending portions in the second alignment mark 42 are overlapped when viewed from the top.

Specifically, as shown in FIG. 9, the first extending portion 13 and the fourth extending portion 16 in the first alignment mark 41 are overlapped with the seventh extending portion 20 and the sixth extending portion 19 in the second alignment mark 42, respectively.

As shown in FIG. 9, specifically, in the modified example, the first extending portion 13 and the seventh extending portion 20 intersect (are perpendicular), and the fourth extending portion 16 and the sixth extending portion 19 intersect (are perpendicular) when viewed from the top.

In the modified example shown in FIG. 9, the first starting point portion 10 is not overlapped with the second alignment mark 42, and the second starting point portion 17 is not overlapped with the first alignment mark 41 when viewed from the top.

In the modified example shown in FIG. 9, it is possible to dispose the first alignment mark 41 and the second alignment mark 42 more compactly, as compared with the wiring circuit board 1 shown in FIG. 8 in which one extending portion of the first alignment mark 41 and one extending portion of the second alignment mark 42 are overlapped when viewed from the top.

In the modified example shown in FIG. 10, the second starting point portion 17, and a front end portion (free end portion) of the first extending portion 13 are overlapped when viewed from the top.

On the other hand, the first starting point portion 10 is disposed to be deviated from the second alignment mark 42 when viewed from the top. That is, the first starting point portion 10 is not overlapped with the second starting point portion 17.

In the modified example shown in FIG. 10, since the second starting point portion 17 is overlapped with the first alignment mark 41 when viewed from the top, it is possible to dispose the first alignment mark 41 and the second alignment mark 42 more compactly, as compared with the modified example of FIG. 9 in which the second starting point portion 17 is disposed to be deviated from the first alignment mark 41. Therefore, it is possible to dispose the first alignment mark 41 and the second alignment mark 42 compactly, while preventing the formation of a through hole due to the overlap of the first starting point portion 10 and the second starting point portion 17 in which an etching solution tends to be retained.

Figure 11:
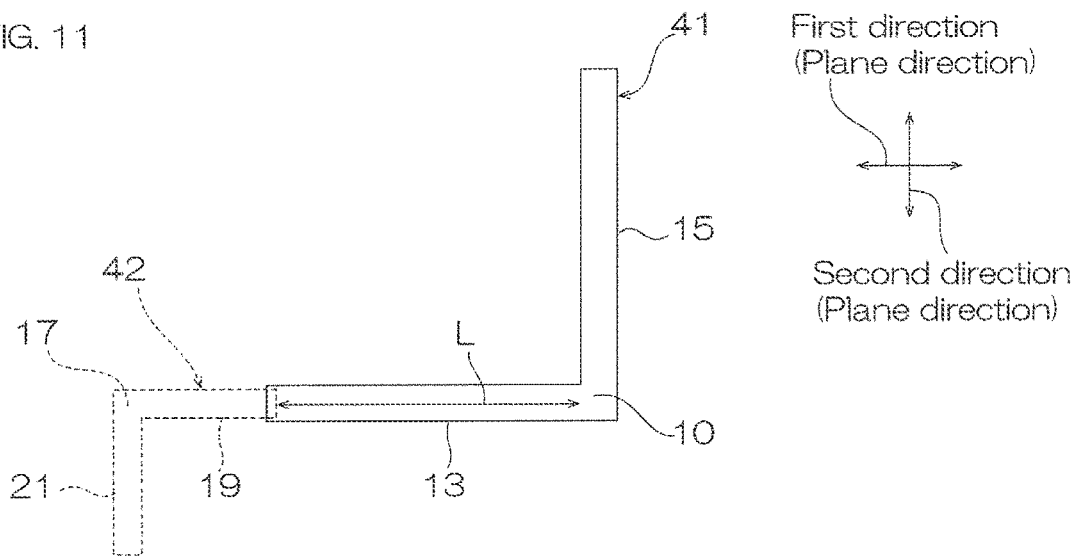
FIG. 11 shows a plan view of a further modified example of the first alignment mark and the second alignment mark obtained by further modifying the first alignment mark and the second alignment mark shown in FIG. 8.

FIG. 11 shows a further modified example obtained by changing the shape of the first alignment mark 41 and the second alignment mark 42 in the modified example shown in FIG. 8 into a generally L-shape when viewed from the top. The modified example shown in FIG. 11 can achieve the same function and effect as that of the modified example shown in FIG. 8.

Figure 12:
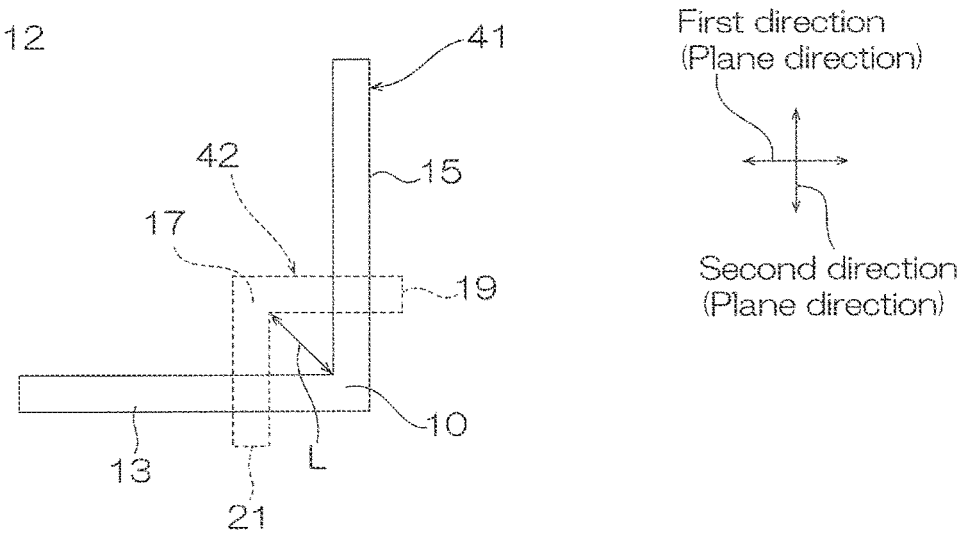
FIG. 12 shows a plan view of a further modified example of the first alignment mark and the second alignment mark obtained by further modifying the first alignment mark and the second alignment mark shown in FIG. 9.

FIG. 12 shows a further modified example obtained by changing the shape of the first alignment mark 41 and the second alignment mark 42 in the modified example shown in FIG. 9 into a generally L-shape when viewed from the top. The modified example shown in FIG. 12 can achieve the same function and effect as that of the modified example shown in FIG. 9.

Figure 13:
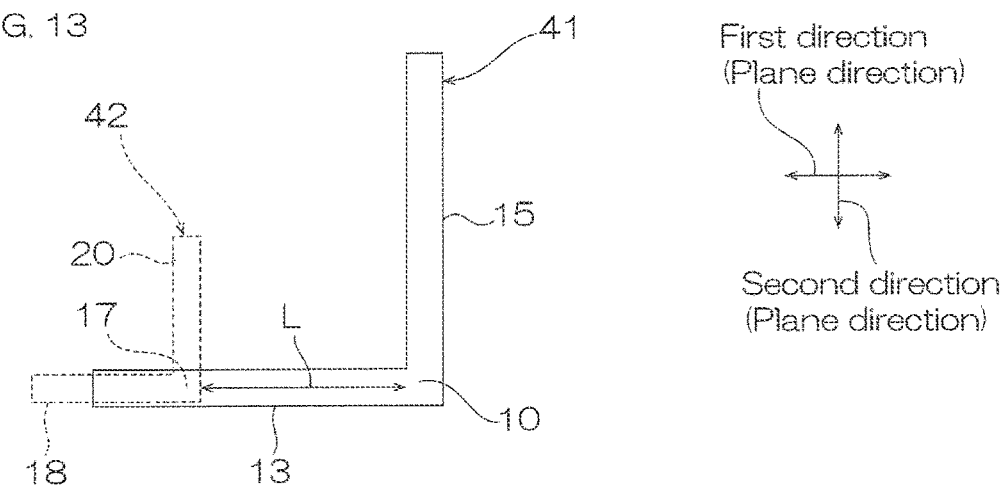
FIG. 13 shows a plan view of a further modified example of the first alignment mark and the second alignment mark obtained by further modifying the first alignment mark and the second alignment mark shown in FIG. 10.

FIG. 13 shows a further modified example obtained by changing the shape of the first alignment mark 41 and the second alignment mark 42 in the modified example shown in FIG. 10 into a generally L-shape when viewed from the top. The modified example shown in FIG. 13 can achieve the same function and effect as that of the modified example shown in FIG. 10.

Further, as shown in FIG. 14, the second alignment mark 42 may also have the plurality of (four) second starting point portions 17.

Specifically, the second alignment mark 42 has a generally rectangular frame shape when viewed from the top surrounding the first alignment mark 41 outside of the first alignment mark 41, and has four corner portions 24 are four corner portions 24 correspond to the second starting point portion 17 as one example of a second portion. In the modified example, the first alignment mark 41 and the second alignment mark 42 are deviated and not overlapped when viewed from the top.

The number of the second starting point portion 17 is not limited to the description above, and as shown in FIG. 15, the number thereof may be 12.

In the modified example shown in FIG. 15, the second alignment mark 42 has an endless frame shape disposed so as to surround the first alignment mark 41 outside the first alignment mark 41 having a generally+shape when viewed from the top. The second alignment mark 42 has a shape along (corresponding to) the outer end edge of the first alignment mark 41. The second alignment mark 42 has a frame shape when viewed from the top similar to the outer end edge of the first alignment mark 41. Specifically, the second alignment mark 42 integrally has four U-shaped members 36 having a U-shape when viewed from the top having an opening inwardly. The three corner portions 24 are provided per the one U-shaped member 36. Therefore, the second alignment mark 42 includes 3×4=12 corner portions 24.

As shown in FIG. 16, the first alignment mark 41 may also have a first center of gravity portion C1 of a solid portion 30 as a first portion instead of the first starting point portion 10.

The solid portion 30 is a solid pattern along the plane direction, and does not have an opening such as a through hole in a region inside the outer end edge of the solid portion 30 when viewed from the top. Specifically, the solid portion 30 has a generally rectangular shape when viewed from the top.

The first center of gravity portion C1 is provided (included) in the solid portion 30. The solid portion 30 has a "center of gravity", and when projected in the thickness direction, in a case where the "center of gravity" is overlapped with the solid portion 30, it is provided (included) in the solid portion 30 as the center of gravity portion (specifically, the first center of gravity portion C1).

In the first center of gravity portion C1, when the first alignment mark 41 is soft etched, an etching solution tends to be retained as compared with the surrounding portion of the first center of gravity portion C1 in the first alignment mark 41, and therefore, the speed at which the position in the thickness direction of the first center of gravity portion C1 moves toward the other side in the thickness direction is fast as compared with that of the surrounding portion.

The plane area of the solid portion 30 is, for example, 0.001 mm² or more, preferably 0.005 mm² or more, more preferably 0.01 mm² or more, and for example, 100 mm² or less, preferably 50 mm² or less, more preferably 30 mm² or less.

In the wiring circuit board 1, the first center of gravity portion C1 is deviated from the corner portion 24 when viewed from the top to satisfy the condition A. Therefore, when the first alignment mark 41 and the second alignment mark 42 are soft etched, it is possible to prevent the formation of a through hole due to the overlap of the first center of gravity portion C1 and the corner portion 24 even with the movement of the position in the thickness direction of the first center of gravity portion C1 toward the other side, and the movement of the position in the thickness direction of the corner portion 24 toward one side. Therefore, the first alignment mark 41 and the second alignment mark 42 have excellent visibility.

Further, in the wiring circuit board 1, since the first alignment mark 41 has the first center of gravity portion C1 of the solid portion 30, and the second alignment mark 42 surrounds the first alignment mark 41 when viewed from the top, it is possible to dispose the first alignment mark 41 and the second alignment mark 42 compactly in the peripheral region 8 when viewed from the top. Therefore, it is possible to miniaturize the wiring circuit board 1.

In the modified example shown in FIG. 16, though the first alignment mark 41 is surrounded by the second alignment mark 42, as shown in FIG. 17, the first alignment mark 41 may be disposed outside the second alignment mark 42 without being surrounded by the second alignment mark 42.

As shown in FIGS. 18 to 20, the first alignment mark 41 can be overlapped with a line segment portion 37 in the second alignment mark 42.

The four line segment portions 37 are provided in the second alignment mark 42, and each line segment portion 37 connects the two corner portions 24. One of the four line segment portions 37 is overlapped with the first alignment mark 41.

In the modified example shown in FIG. 18, the first center of gravity portion C1 is disposed to be deviated outwardly from the line segment portion 37.

In the modified example shown in FIG. 19, the first center of gravity portion C1 is overlapped with the line segment portion 37. However, the first center of gravity portion C1 is disposed to be deviated from the corner portions 24 (the second starting point portions 17) disposed at both ends of the line segment portion 37.

In the modified example shown in FIG. 20, the first center of gravity portion C1 is disposed to be deviated inwardly from the line segment portion 37.

Of the modified examples of FIGS. 18 to 20, from the viewpoint of disposing the first alignment mark 41 and the second alignment mark 42 compactly, the modified examples of FIGS. 19 and 20 are preferable, and the modified example of FIG. 20 is more preferable.

On the other hand, of the modified examples of FIGS. 18 to 20, from the viewpoint of preventing the through hole in the first center of gravity portion C1, the modified examples of FIGS. 18 and 20 in which the line segment portion 37 and the first center of gravity portion C1 are disposed to be deviated from each other are preferable.

A shape of the first alignment mark 41 is not particularly limited as long as it includes the first center of gravity portion C1 and, though not shown, examples of the shape thereof may include generally polygonal shapes (excluding rectangular shape) such as triangular shape, pentagonal shape, and hexagonal shape when viewed from the top. Further, as shown in FIG. 21, an example of the shape thereof may also include a generally circular shape when viewed from the top.

In the modified examples of FIGS. 15 to 21, the second alignment mark 42 has an endless shape. Alternatively, as shown in FIG. 22, the second alignment mark 42 may also have a shape having an end.

The second alignment mark 42 has the one U-shaped member 36 and has the two corner portions 24 (the second starting point portions 17).

Further, the number of the solid portions 30 is not particularly limited, and as shown in FIG. 23, the number may be plural.

The first alignment mark 41 has the plurality of (four) solid portions 30. The plurality of solid portions 30 are provided corresponding to the plurality of extending portions (the fifth extending portion 18, the sixth extending portion 19, the seventh extending portion 20, and the eighth extending portion 21). The solid portion 30 is disposed to be deviated from the second starting point portion 17, while being overlapped with the free end portion of the extending portion.

FIG. 24 shows a further modified example obtained by changing the shape of the second alignment mark 42 in the modified example shown in FIG. 23 into a generally L-shape when viewed from the top. The modified example shown in FIG. 24 can achieve the same function and effect as that of the modified example shown in FIG. 23.

Further, in the modified example of FIGS. 16 to 24, any one of the first alignment mark 41 and the second alignment mark 42 (specifically, the first alignment mark 41) has the solid portion 30. Alternatively, as shown in FIGS. 25 to 28, both may also have the solid portion 30.

Figure 25:
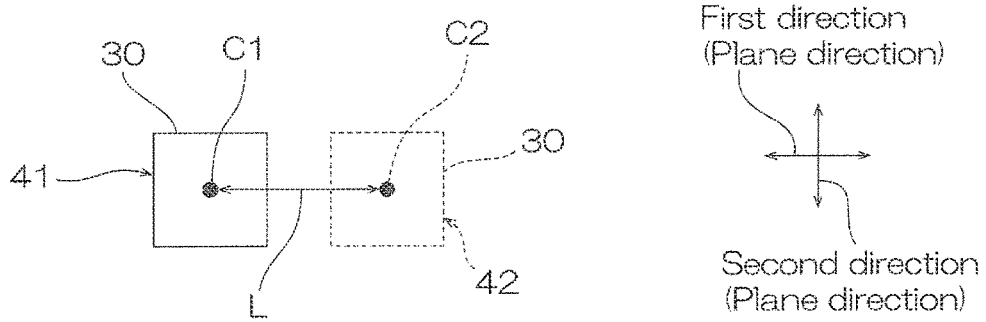
FIG. 25 shows a plan view of a modified example of the first alignment mark and the second alignment mark shown in FIG. 1B.

As shown in FIG. 25, the second alignment mark 42 has the solid portion 30 having a generally rectangular shape, and the solid portion 30 has a second center of gravity portion C2.

The second center of gravity portion C2 is provided (included) in the solid portion 30 of the second alignment mark 42. The solid portion 30 has a "center of gravity", and when projected in the thickness direction, in a case where the "center of gravity" is overlapped with the solid portion 30, it is provided (included) in the solid portion 30 as the center of gravity portion (specifically, the second center of gravity portion C2).

In the second center of gravity portion C2, when the second alignment mark 42 is soft etched, an etching solution tends to be retained as compared with the surrounding portion of the second center of gravity portion C2 in the second alignment mark 42, and therefore, the speed at which the position in the thickness direction of the second center of gravity portion C2 moves toward one side in the thickness direction is fast as compared with that of the surrounding portion.

The first center of gravity portion C1 and the second center of gravity portion C2 are disposed to be deviated from each other when viewed from the top.

The deviation amount L of the first center of gravity portion C1 and the second center of gravity portion C2, together with the maximum length Z of the wiring circuit board 1, satisfies the following formula.

$$Z/100{,}000 \leq L \leq Z \times 2/3$$

The upper limit of the deviation amount L is preferably $[Z \times 1/2]$, more preferably $[Z \times 1/3]$.

Further, the lower limit of the deviation amount L is preferably $[Z/10{,}000]$, more preferably $[Z/5{,}000]$, further more preferably $[Z/3{,}000]$.

Further, the second alignment mark 42 is deviated from the first alignment mark 41 without being overlapped when viewed from the top.

Figure 26:
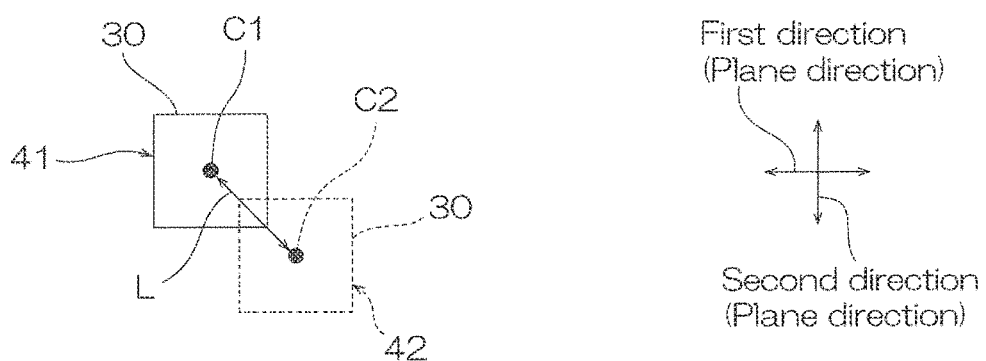
FIG. 26 shows a plan view of a further modified example of the first alignment mark and the second alignment mark shown in FIG. 25.

As shown in FIG. 26, a portion of the first alignment mark 41 and a portion of the second alignment mark 42 are allowed to be overlapped.

Specifically, as shown in FIG. 26, a corner portion of the first alignment mark 41, and the second alignment mark 42 are overlapped when viewed from the top. However, the first center of gravity portion C1 is disposed to be deviated from the second center of gravity portion C2.

Figure 27:
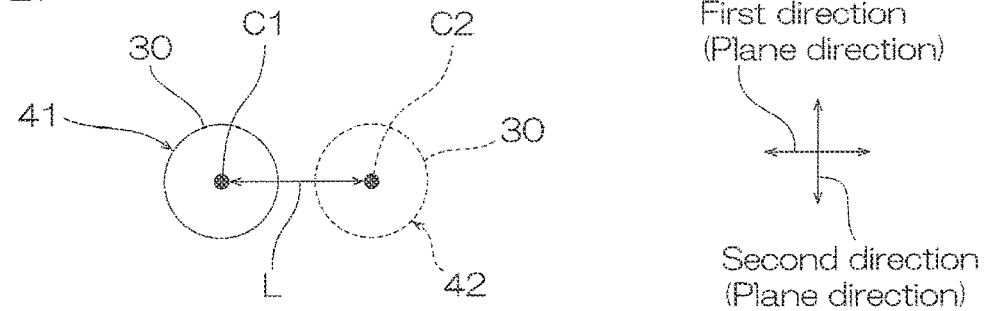
FIG. 27 shows a plan view of a further modified example of the first alignment mark and the second alignment mark shown in FIG. 25.
Figure 28:
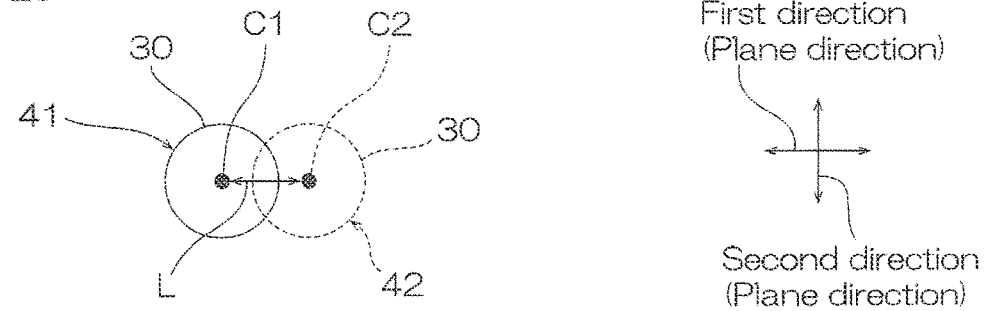
FIG. 28 shows a plan view of a further modified example of the first alignment mark and the second alignment mark shown in FIG. 26.

The shape of the solid portion 30 of the second alignment mark 42 is not limited to the description above, and as shown in FIGS. 27 to 28, the shape thereof may be generally circular.

FIGS. 27 and 28 are modified examples obtained by changing the first alignment mark 41 and the second alignment mark 42 in FIGS. 25 and 26 into a generally circular shape.

Second Embodiment

In the second embodiment below, the same reference numerals are provided for members and steps corresponding to each of those in the above-described first embodiment and the modified examples, and their detailed description is omitted. The second embodiment can achieve the same function and effect as that of the first embodiment and the modified examples unless otherwise specified. Furthermore, the first embodiment and each modified example can be appropriately used in combination.

The wiring circuit board 1 of the second embodiment satisfies the condition B, and the second alignment mark 42 does not have the second portion, while the first alignment mark 41 has the first portion.

Specifically, as shown in FIGS. 29A to 29B, the first alignment mark 41 has the first center of gravity portion C1 of the solid portion 30 which is one example of a first portion.

On the other hand, the second alignment mark 42 does not have the second center of gravity portion C2 and the second starting point portion 17. That is, the second alignment mark 42 does not have the second portion. Specifically, the second alignment mark 42 has a generally circular ring shape when viewed from the top, and is disposed outside in a radial direction of the first alignment mark 41 at spaced intervals thereto.

In the second embodiment, the first center of gravity portion C1 of the first alignment mark 41 is disposed to be deviated from the second alignment mark 42 when viewed from the top.

When the second alignment mark 42 is soft etched, since the second alignment mark 42 does not have the second portion (the second starting point portion 17 or the second center of gravity portion C2 (described later)), it is possible to suppress the retention of the etching solution in the second alignment mark 42.

The shortest distance L between the first alignment mark 41 and the second alignment mark 42, together with the maximum length Z of the wiring circuit board 1, satisfies the following formula.

$$Z/100{,}000 \leq L \leq Z \times 2/3$$

The upper limit of the shortest distance L is preferably $[Z \times 1/2]$, more preferably $[Z \times 1/3]$.

Further, the lower limit of the shortest distance L is preferably $[X/10{,}000]$, more preferably $[X/5{,}000]$, further more preferably $[X/3{,}000]$.

Specifically, the shortest distance L is, for example, 10 mm or less, preferably 7.5 mm or less, more preferably 5 mm or less, further more preferably 3 mm or less, and for example, 0.05 mm or more, preferably 0.03 mm or more, more preferably 0.1 mm or more.

Furthermore, the shortest distance L2 between the first center of gravity portion C1 and the second alignment mark 42, together with the maximum length Z in the plane direction of the wiring circuit board 1, satisfies the following formula.

$$Z/100{,}000 \leq L2 \leq Z \times 2/3$$

The upper limit of the shortest distance L2 is preferably $[Z \times 1/2]$, more preferably $[Z \times 1/3]$.

Further, the lower limit of the shortest distance L2 is preferably $[X/10{,}000]$, more preferably $[X/5{,}000]$, further more preferably $[X/3{,}000]$.

Further, since the second alignment mark 42 does not have the second portion, the wiring circuit board 1 satisfies the condition B Therefore, when the second alignment mark 42 is soft etched, it is possible to suppress the retention of the etching solution in the second alignment mark 42, and therefore, to slowly move the position in the thickness direction of the second alignment mark 42 toward one side. That is, it is possible to suppress great movement of the position in the thickness direction of the second alignment mark 42 toward one side in the thickness direction.

At the same time, since the shortest distance L between the first alignment mark 41 and the second alignment mark 42 satisfies the above-described formula, the wiring circuit board 1 is miniaturized, and it is possible to simultaneously carry out the alignment using the first alignment mark 41, and the alignment using the second alignment mark 42.

Furthermore, since the first center of gravity portion C1 is deviated from the second alignment mark 42 when viewed from the top, when the first alignment mark 41 and the second alignment mark 42 are soft etched, it is possible to prevent the formation of a through hole due to the overlap of the first center of gravity portion C1 and the second alignment mark 42 even with the movement of the position in the thickness direction of the first center of gravity portion C1 toward the other side. Therefore, the first alignment mark 41 and the second alignment mark 42 have excellent visibility.

Furthermore, when the shortest distance L2 between the first center of gravity portion C1 and the second alignment mark 42 satisfies the above-described formula, the wiring circuit board 1 is miniaturized, and it is possible to simultaneously carry out the alignment using the first alignment mark 41 including the first center of gravity portion C1, and the alignment using the second alignment mark 42.

MODIFIED EXAMPLES

In each modified example below, the same reference numerals are provided for members and steps corresponding to each of those in the above-described first and second embodiments, and their detailed description is omitted. Each modified example can achieve the same function and effect as that of the first and second embodiments unless otherwise specified. Furthermore, the first and second embodiments and each modified example can be appropriately used in combination.

In the modified example shown in FIGS. 30A to 30B, the second alignment mark 42 is included in the first alignment mark 41 when viewed from the top, and specifically, is disposed inside the outer end edge of the first alignment mark 41 at spaced intervals thereto. The second alignment mark 42 is overlapped with the peripheral end portion of the first alignment mark 41 over the radial direction when viewed from the top. Therefore, it is possible to dispose the first alignment mark 41 and the second alignment mark 42 compactly.

In the modified examples shown in FIGS. 31A to 31B, the outer end edge of the first alignment mark 41 is disposed between the outer end edge and the inner end edge of the second alignment mark 42. The inner-side portion in the radial direction of the second alignment mark 42 is overlapped with the peripheral end portion of the first alignment mark 41 when viewed from the top.

Of FIGS. 29A to 31B, since the area of the overlapped portion of the second alignment mark 42 and the first alignment mark 41 is less, or there is no overlapped portion, from the viewpoint of suppressing the formation of a through hole due to this, the modified examples of FIGS. 29A to 30B are preferable, and furthermore, the modified example of FIGS. 29A to 29B in which the second alignment mark 42 and the first alignment mark 41 are deviated is more preferable.

Figure 32:
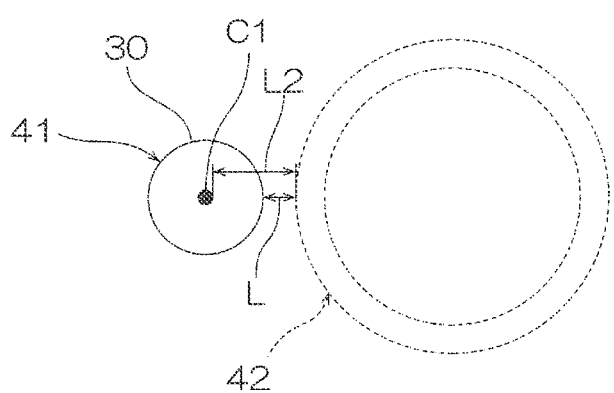
FIG. 32 shows a plan view of a further modified example of the first alignment mark and the second alignment mark shown in FIG. 29A.

In the modified example shown in FIG. 32, the first center of gravity portion C1 is disposed to be deviated outwardly with respect to the second alignment mark 42. Therefore, the configuration of the first alignment mark 41 and the second alignment mark 42 is simple.

Figure 33:
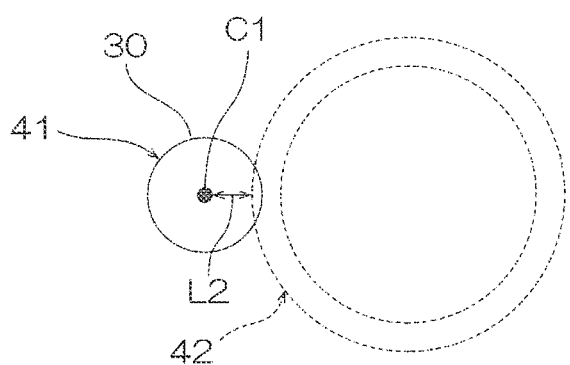
FIG. 33 shows a plan view of a further modified example of the first alignment mark and the second alignment mark shown in FIG. 29A.
Figure 34:
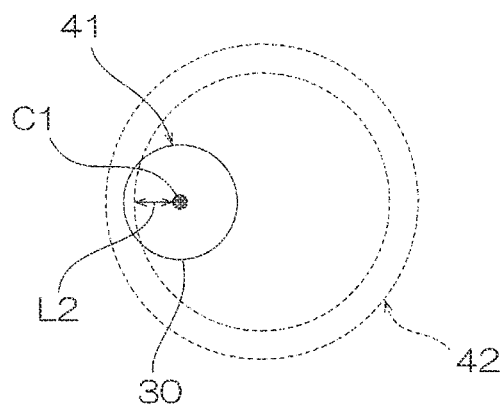
FIG. 34 shows a plan view of a further modified example of the first alignment mark and the second alignment mark shown in FIG. 29A.
Figure 42A:
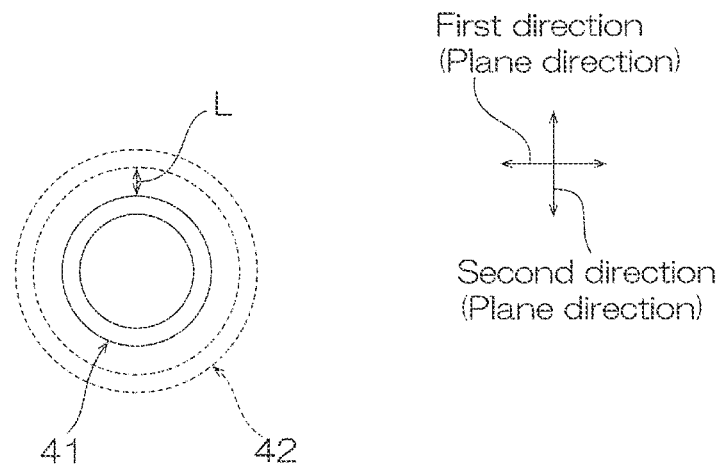
FIGS. 42A to 42B show a first alignment mark and a second alignment mark of a third embodiment of the present invention.
Figure 42B:
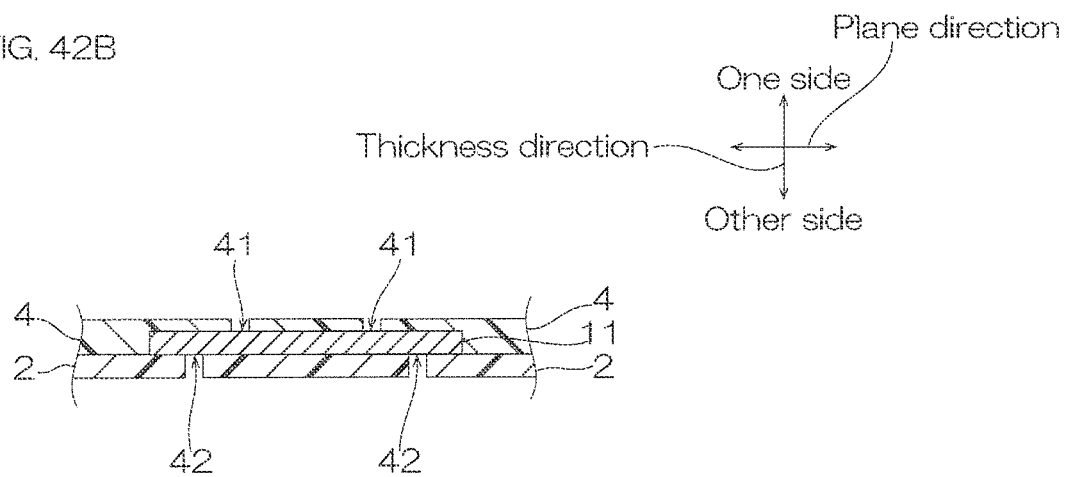

In the modified examples shown in FIGS. 33 to 34, a portion of the peripheral end portion of the first alignment mark 41 is overlapped with the second alignment mark 42.

In the modified example shown in FIG. 33, the first center of gravity portion C1 is disposed to be deviated outwardly from the second alignment mark 42.

In the modified example shown in FIG. 34, the first center of gravity portion C1 is disposed to be deviated inwardly from the second alignment mark 42.

Of the modified examples of FIGS. 32 to 34, from the viewpoint of disposing the first alignment mark 41 and the second alignment mark 42 compactly, the modified examples of FIGS. 33 to 34 are preferable, and the modified example of FIG. 34 is more preferable.

A shape of the second alignment mark 42 is not particularly limited unless it has the second portion (the second starting point portion 17 or the second center of gravity portion C2), and as shown in FIG. 35, the shape thereof may be, for example, generally semicircular arc when viewed from the top.

As shown in FIGS. 36 to 38, the first alignment mark 41 may also have a generally rectangular shape when viewed from the top having the first center of gravity portion C1.

As shown in FIG. 36, the first alignment mark 41 is disposed inside the second alignment mark 42 at spaced intervals thereto. Therefore, the first center of gravity portion C1 is disposed to be deviated from the second alignment mark 42.

As shown in FIG. 37, when the first center of gravity portion C1 is deviated from the second alignment mark 42, the first alignment mark 41 may include the entire second alignment mark 42 when viewed from the top.

Furthermore, as shown in FIG. 38, the corner portion of the first alignment mark 41 is allowed to be overlapped with the second alignment mark 42 when viewed from the top.

Further, as shown in FIGS. 39 to 40, the first alignment mark 41 has the first starting point portion 10 instead of the first center of gravity portion C1, and the first starting point portion 10 may be also disposed to be deviated from the second alignment mark 42 when viewed from the top.

In FIG. 39, the first alignment mark 41 is disposed to be deviated inwardly from the second alignment mark 42 when viewed from the top. Specifically, the first alignment mark 41 is surrounded by the second alignment mark 42 when viewed from the top.

In FIG. 40, the first extending portion 13 to the fourth extending portion 16 are overlapped with the second alignment mark 42 when viewed from the top.

Of FIGS. 39 to 40, from the viewpoint of preventing the formation of a through hole, the modified example of FIG. 39 is preferable.

On the other hand, of FIGS. 39 to 40, from the viewpoint of disposing the first alignment mark 41 and the second alignment mark 42 compactly, the modified example of FIG. 40 is preferable.

Furthermore, in the second embodiment and the modified examples thereof, as shown in FIGS. 29A to 40, the first center of gravity portion C1 is disposed to be deviated from the second alignment mark 42 when viewed from the top. However, as shown in FIGS. 41A to 41C, the first center of gravity portion C1 which is one example of a first portion or the first starting point portion 10 may be also overlapped with the second alignment mark 42 when viewed from the top.

In the modified example shown in FIG. 41A, the first alignment mark 41 includes the solid portion 30 having a generally circular shape when viewed from the top, and the first center of gravity portion C1 of the solid portion 30 is overlapped with the second alignment mark 42 when viewed from the top.

In the modified example shown in FIG. 41B, the first alignment mark 41 includes the solid portion 30 having a generally rectangular shape when viewed from the top, and the first center of gravity portion C1 of the solid portion 30 is overlapped with the second alignment mark 42 when viewed from the top.

In the modified example shown in FIG. 41C, the first alignment mark 41 includes the first starting point portion 10, and the first starting point portion 10 is overlapped with the second alignment mark 42 when viewed from the top.

According to the modified example of FIGS. 41A to 41C, when the first alignment mark 41 and the second alignment mark 42 are soft etched, since the second alignment mark 42 does not have the above-described second portion, it is possible to suppress the rapid movement of the position in the thickness direction toward one side due to the retention of the etching solution in the second portion. Therefore, it is possible to achieve the slow movement of the position in the thickness direction of the second alignment mark 42 toward one side.

As a result, as shown in FIGS. 41A to 41C, even when the first center of gravity portion C1 which is one example of a first portion or the first starting point portion 10 is overlapped with the second alignment mark 42 when viewed from the top, since the position in the thickness direction of the second alignment mark 42 slowly moves toward one side, it is possible to suppress the formation of the above-described through hole.

The second embodiment and the modified examples shown in FIGS. 29A to 40 are preferable as compared with the modified example shown in FIGS. 41A to 41C. In the second embodiment and the modified examples shown in FIGS. 29A to 40, since the first center of gravity portion C1 is disposed to be deviated from the second alignment mark 42 when viewed from the top, it is possible to prevent the formation of a through hole due to the overlap of the first center of gravity portion C1 or the first starting point portion 10 and the second alignment mark 42.

Third Embodiment

In the third embodiment below, the same reference numerals are provided for members and steps corresponding to each of those in the above-described first and second embodiments, and the modified examples, and their detailed description is omitted. The third embodiment can achieve the same function and effect as that of the first and second embodiments, and the modified examples unless otherwise specified. Furthermore, the first and second embodiments and each modified example can be appropriately used in combination.

The wiring circuit board 1 of the third embodiment satisfies the condition B, the first alignment mark 41 does not have the first portion, and the second alignment mark 42 does not have the second portion.

Specifically, as shown in FIGS. 42A to 47, the first alignment mark 41 does not have the first starting point portion 10 and the first center of gravity portion C1 of the solid portion 30. That is, the first alignment mark 41 does not have the first portion. The second alignment mark 42 also does not have the second starting point portion 17 and the second center of gravity portion C2 of the solid portion 30. That is, the second alignment mark 42 does not have the second portion.

The first alignment mark 41 has a generally circular ring shape when viewed from the top. The first alignment mark 41 has the center of gravity, and it does not have the first center of gravity portion C1 which is overlapped with the first alignment mark 41 when viewed from the top.

The second alignment mark 42 has the center of gravity, and it does not have the second center of gravity portion C2 which is overlapped with the second alignment mark 42 when viewed from the top.

Then, the second alignment mark 42 is disposed to be deviated outwardly from the first alignment mark 41 when viewed from the top. Specifically, the second alignment mark 42 has a generally circular ring shape when viewed from the top which is larger than the first alignment mark 41.

The deviation amount L of the first alignment mark 41 and the second alignment mark 42 is the shortest distance between the outer end edge of the first alignment mark 41 and the inner end edge of the second alignment mark 42, and together with the maximum length Z of the wiring circuit board 1, satisfies the following formula.

$$Z/100{,}000 \leq L \leq Z \times 2/3$$

The upper limit of the deviation amount L is preferably $[Z \times 1/2]$, more preferably $[Z \times 1/3]$.

Further, the lower limit of the deviation amount L is preferably $[X/10{,}000]$, more preferably $[X/5{,}000]$, further more preferably $[X/3{,}000]$.

When the first alignment mark 41 and the second alignment mark 42 are soft etched, since the first alignment mark 41 does not have the first portion, and the second alignment mark 42 does not have the second portion, it is possible to suppress the retention of the etching solution in both the first alignment mark 41 and the second alignment mark 42.

Then, the third embodiment satisfies the condition B, the first alignment mark 41 does not have the first portion, and the second alignment mark 42 does not have the second portion. Therefore, when the first alignment mark 41 and the second alignment mark 42 are soft etched, it is possible to suppress the rapid movement of the position in the thickness direction of the first alignment mark 41 toward the other side due to the retention of the etching solution in the first portion described above, and to suppress the rapid movement of the position in the thickness direction of the second alignment mark 42 toward one side due to the retention of the etching solution in the second portion described above. Therefore, it is possible to achieve both the slow movement of the position in the thickness direction of the first alignment mark 41 toward the other side, and the slow movement of the position in the thickness direction of the second alignment mark 42 toward one side.

Further, in the third embodiment, since the first alignment mark 41 is deviated from the second alignment mark 42 when viewed from the top, when the first alignment mark 41 and the second alignment mark 42 are soft etched, it is possible to prevent the formation of a through hole due to the overlap of the first alignment mark 41 and the second alignment mark 42. Therefore, the first alignment mark 41 and the second alignment mark 42 have excellent visibility.

At the same time, since the first alignment mark 41 is deviated from the second alignment mark 42 by the deviation amount L satisfying the above-described formula, the wiring circuit board 1 is miniaturized, and it is possible to simultaneously carry out the alignment using the first alignment mark 41, and the alignment using the second alignment mark 42.

Therefore, the wiring circuit board 1 includes the first alignment mark 41 and the second alignment mark 42 having excellent visibility, and is capable of simultaneously carrying out the alignment using these, while miniaturization and thinning thereof are achieved.

MODIFIED EXAMPLES

In each modified example below, the same reference numerals are provided for members and steps corresponding to each of those in the above-described first to third embodiments, and their detailed description is omitted. Each modified example can achieve the same function and effect as that of the first to third embodiments unless otherwise specified. Furthermore, the first to third embodiments and each modified example can be appropriately used in combination.

Figure 43:
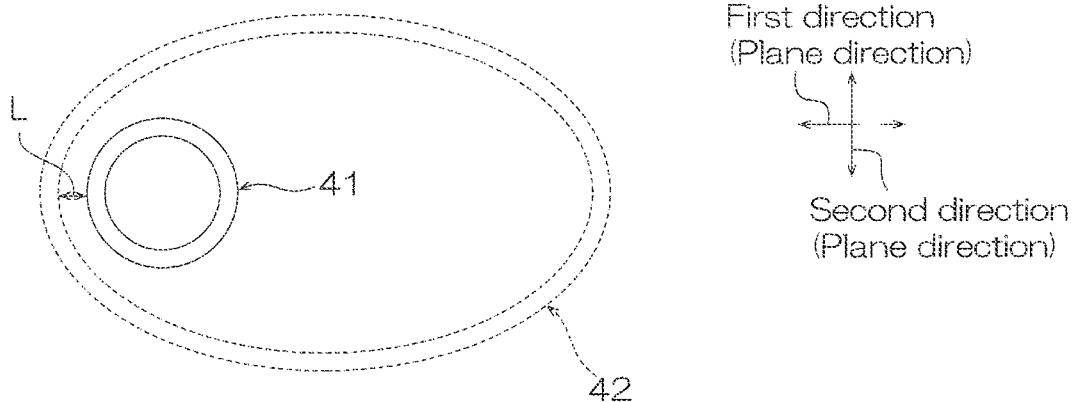
FIG. 43 shows a plan view of a modified example of the first alignment mark and the second alignment mark shown in FIG. 42A.

A shape of the second alignment mark 42 is not particularly limited as long as it does not have the second portion, and as shown in FIG. 43, may be generally elliptical when viewed from the top.

Figure 44:
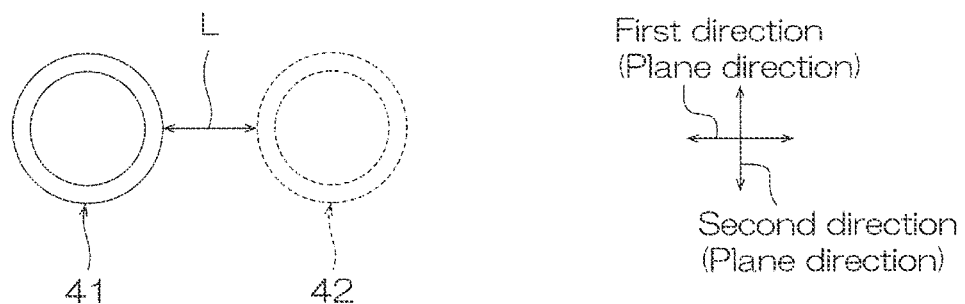
FIG. 44 shows a plan view of a modified example of the first alignment mark and the second alignment mark shown in FIG. 42A.

As shown in FIG. 44, the first alignment mark 41 may be disposed to be deviated outwardly from the second alignment mark 42. The first alignment mark 41 and the second alignment mark 42 are deviated from each other when viewed from the top. Therefore, the configuration of the first alignment mark 41 and the second alignment mark 42 is simple.

As shown in FIG. 45, the first alignment mark 41 may also have a generally arc shape when viewed from the top having an opening toward one side, and the second alignment mark 42 may also have an arc shape when viewed from the top having an opening toward the other side.

As shown in FIG. 46, both the first alignment mark 41 and the second alignment mark 42 may have a generally arc shape when viewed from the top having an opening toward the same direction.

Further, as shown in FIG. 47, both the first alignment mark 41 and the second alignment mark 42 may have a generally C-shape when viewed from the top.

When viewed from the top, the second alignment mark 42 passes between the two free end portions of the first alignment mark 41, and the first alignment mark 41 passes between the two free end portions of the second alignment mark 42.

Furthermore, in the third embodiment and the modified examples thereof, as shown in FIGS. 42A to 47, the first alignment mark 41 is disposed to be deviated from the second alignment mark 42 when viewed from the top. Alternatively, as shown in FIGS. 48A to 48B, the first alignment mark 41 may be also overlapped with the second alignment mark 42 when viewed from the top.

The second alignment mark 42 has the same generally circular ring shape when viewed from the top as the first alignment mark 41. The first alignment mark 41 and the second alignment mark 42 are overlapped with each other when viewed from the top.

In the modified example, even when the first alignment mark 41 and the second alignment mark 42 are overlapped, when the first alignment mark 41 and the second alignment mark 42 are soft etched, since it is possible to achieve both the slow movement of the position in the thickness direction of the first alignment mark 41 toward the other side, and the slow movement of the position in the thickness direction of the second alignment mark 42 toward one side, it is possible to suppress the formation of a through hole due to the overlap of the first alignment mark 41 and the second alignment mark 42.

Figure 48A:
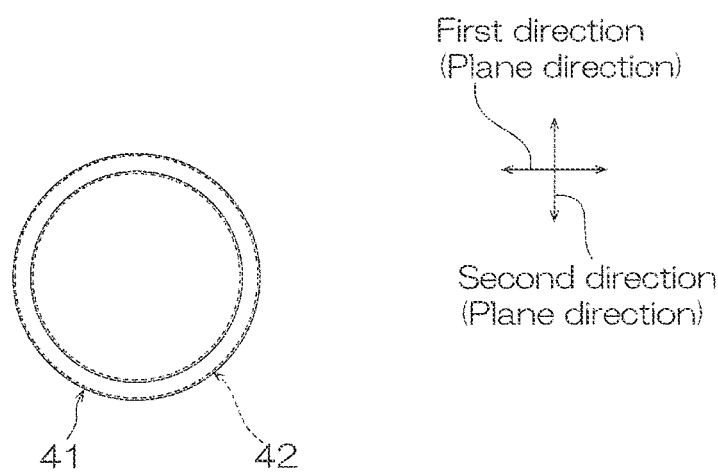
FIGS. 48A to 48B show a further modified example (modified example in which the first alignment mark is overlapped with the second alignment mark) of the first alignment mark and the second alignment mark shown in FIGS. 42A to 42B.
Figure 48B:
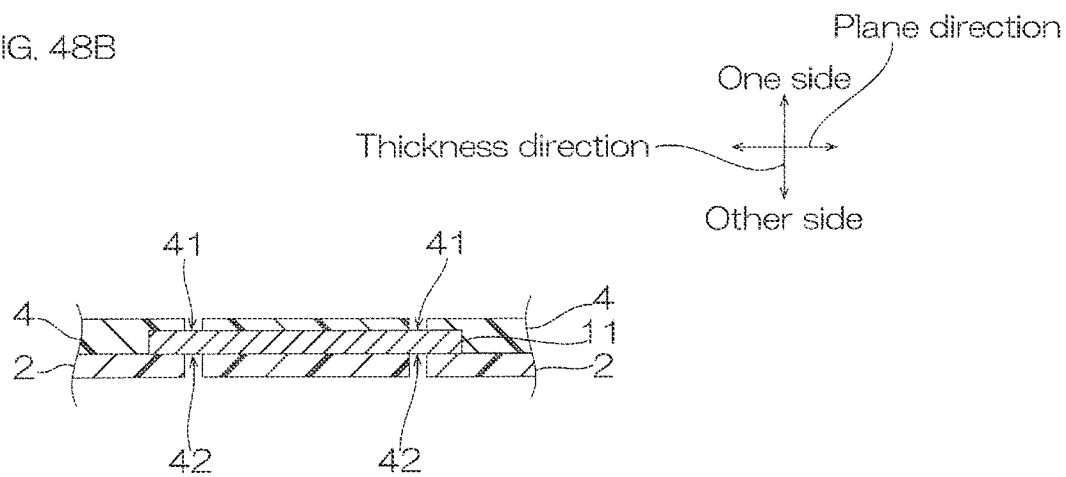

The third embodiment and the modified examples shown in FIGS. 42A to 47 are preferable as compared with the modified example shown in FIGS. 48A to 48B. In the third embodiment and the modified examples shown in FIGS. 42A to 47, since the first alignment mark 41 is disposed to be deviated from the second alignment mark 42 when viewed from the top, it is possible to prevent the formation of a through hole due to the overlap of the first alignment mark 41 and the second alignment mark 42.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for various applications.

DESCRIPTION OF REFERENCE NUMERALS

1 Wiring circuit board
2 Base insulating layer
4 Cover insulating layer
10 First starting point portion (one example of first portion)
11 Alignment mark layer
12 Second alignment mark layer
17 Second starting point portion (one example of second portion)
30 Solid portion
41 First alignment mark
42 Second alignment mark
C1 First center of gravity portion (one example of first portion)
C2 Second center of gravity portion (one example of second portion)

The invention claimed is:

1. A wiring circuit board comprising:
an alignment mark layer; and
an insulating layer disposed at one side and the other side in a thickness direction of the alignment mark layer, wherein,
the alignment mark layer includes:
a first alignment mark exposed from the insulating layer toward one side in the thickness direction; and
a second alignment mark exposed from the insulating layer toward the other side in the thickness direction, wherein,
the alignment mark layer has one surface and the other surface facing each other in the thickness direction,
the insulating layer disposed at one side in the thickness direction of the alignment mark layer has an opening portion corresponding to the first alignment mark,
the insulating layer disposed at the other side in the thickness direction of the alignment mark layer has an opening portion corresponding to the second alignment mark,
the first alignment mark is a portion exposed from the opening portion toward one side in one surface of the alignment mark layer,
the second alignment mark is a portion exposed from the opening portion toward the other side in the other surface of the alignment mark layer, and
the first alignment mark and the second alignment mark satisfy the following condition A or condition B;
condition A: the first alignment mark has a first portion which is at least one portion selected from the group consisting of a first starting point portion extending in a plurality of directions in a direction perpendicular to the thickness direction, and a first center of gravity portion of a solid portion continuous in the direction perpendicular to the thickness direction,
wherein the second alignment mark has a second portion which is at least one portion selected from the group consisting of a second starting point portion extending in a plurality of directions in a direction perpendicular to the thickness direction, and a second center of gravity portion of a solid portion continuous in the direction perpendicular to the thickness direction,
wherein the first portion is deviated from the second portion by an amount of L when viewed from the top, and a deviation amount L and the maximum length Z of the wiring circuit board satisfy the following formula, $Z/100,000 \leq L \leq Z \times ^{2}\!/\!_{3}$, and condition B: the first alignment mark has the first portion, and the second alignment mark does not have the second portion, or the first alignment mark does not have the first portion, and the second alignment mark does not have the second portion,
wherein the shortest distance L between the first alignment mark and the second alignment mark when viewed from the top, and the maximum length Z of the wiring circuit board satisfy the following formula, $Z/100{,}000 \leq L \leq Z \times 2/3$.

2. The wiring circuit board according to claim 1, wherein the second alignment mark has the same shape as or a similar shape to the first alignment mark.

3. The wiring circuit board according to claim 1, wherein the first alignment mark and the second alignment mark satisfy the condition B,
the first alignment mark has the first portion, the second alignment mark does not have the second portion,
the first portion is deviated from the second alignment mark by an amount of L when viewed from the top, and the deviation amount L and the maximum length Z of the wiring circuit board satisfy the following formula, $Z/100{,}000 \leq L \leq Z \times 2/3$.

4. The wiring circuit board according to claim 1, wherein the first alignment mark and the second alignment mark are not overlapped when viewed from the top.

5. The wiring circuit board according to claim 4, wherein the second alignment mark surrounds the first alignment mark when viewed from the top.

6. A method for producing a wiring circuit board, the wiring circuit board according to claim 1, comprising the steps of:
disposing an alignment mark layer and an insulating layer,
exposing a first alignment mark from the insulating layer toward one side in a thickness direction,
exposing a second alignment mark from the insulating layer toward the other side in the thickness direction, and
soft etching the first alignment mark and the second alignment mark.

* * * * *